(12) United States Patent
Kim et al.

(10) Patent No.: US 11,709,524 B2
(45) Date of Patent: Jul. 25, 2023

(54) SYSTEM-ON-CHIP INCLUDING DYNAMIC POWER MONITOR AND FREQUENCY CONTROLLER AND OPERATING METHOD THEREOF

(71) Applicant: SAMSUNG ELECTRONICS CO., LTD., Suwon-si (KR)

(72) Inventors: Byungsu Kim, Seoul (KR); Jaehoon Kim, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/736,612

(22) Filed: May 4, 2022

(65) Prior Publication Data

US 2022/0382319 A1 Dec. 1, 2022

(30) Foreign Application Priority Data

May 25, 2021 (KR) .................. 10-2021-0066820

(51) Int. Cl.
*G06F 1/08* (2006.01)
*H03K 19/20* (2006.01)

(52) U.S. Cl.
CPC ............. *G06F 1/08* (2013.01); *H03K 19/20* (2013.01)

(58) Field of Classification Search
CPC ........................................................ G06F 1/08
USPC ........................................................ 327/225
See application file for complete search history.

(56) References Cited

U.S. PATENT DOCUMENTS

| 7,409,568 | B2 | 8/2008 | Tam et al. |
| 7,605,575 | B2 | 10/2009 | Leutgeb et al. |
| 9,563,254 | B2 | 2/2017 | Wells et al. |
| 10,148,258 | B2 | 12/2018 | Carlson et al. |
| 10,261,561 | B2 | 4/2019 | Chuang et al. |
| 10,627,883 | B2 * | 4/2020 | Mehra ............... G06F 1/305 |
| 10,635,159 | B2 * | 4/2020 | Kolla ................. H02M 3/157 |
| 2019/0310698 | A1 | 10/2019 | Mehra |
| 2019/0317546 | A1 * | 10/2019 | Born .................. G06F 1/305 |
| 2020/0081479 | A1 | 3/2020 | Kalyanam et al. |
| 2020/0089299 | A1 * | 3/2020 | Kim .................... H03L 7/097 |
| 2021/0116955 | A1 | 4/2021 | Kim et al. |

FOREIGN PATENT DOCUMENTS

JP 2016-146158 8/2016

* cited by examiner

*Primary Examiner* — Tomi Skibinski
(74) *Attorney, Agent, or Firm* — F. Chau & Associates, LLC

(57) ABSTRACT

A system-on-chip includes: a dynamic power monitor configured to generate a power detection signal by calculating an amount of power consumed by a functional circuit in real time; a frequency controller configured to detect an idle period and a running period of the functional circuit in response to the power detection signal, and generate a clock control signal based on the power detection signal; and a clock controller configured to change a frequency of a clock signal provided to the functional circuit, based on the clock control signal. The running period includes: a first running period in which the frequency of the clock signal has a first value based on the clock control signal; and a second running period in which the frequency of the clock signal has a second value that is greater than the first value based on the clock control signal.

20 Claims, 20 Drawing Sheets

SYSTEM-ON-CHIP INCLUDING DYNAMIC POWER MONITOR AND FREQUENCY CONTROLLER AND OPERATING METHOD THEREOF

CROSS-REFERENCE TO RELATED APPLICATION

This application is based on and claims priority under 35 U.S.C. § 119 to Korean Patent Application No. 10-2021-0066820, filed on May 25, 2021, in the Korean Intellectual Property Office, the disclosure of which is incorporated by reference herein in its entirety.

TECHNICAL FIELD

The inventive concept relates to a semiconductor circuit, and more particularly, to a system-on-chip including a dynamic power monitor and a frequency controller and an operating method of the system-on-chip.

DISCUSSION OF THE RELATED ART

Electronic devices, such as battery-powered user electronic devices, and devices supplied with rectified current, include semiconductor circuits that require power during operation. For example, a semiconductor circuit such as a system-on-chip may be fed a supply voltage that powers all of the operations thereon. A supply voltage in a semiconductor circuit may vary depending on an operating environment and a level of work performed. The supply voltage may be set to a higher value than immediately necessary to prepare for a case in which a voltage level of the supply voltage drops. However, when the supply voltage is set in excess, power consumption of the semiconductor circuit may increase.

Accordingly, there is a need for a power management system for a semiconductor circuit with increased efficiency.

SUMMARY

The inventive concept provides a system-on-chip including a dynamic power monitor and a frequency controller and an operating method of the system-on-chip.

In order to efficiently control a supply voltage, a method is described herein for detecting when the voltage level of the supply voltage begins to decrease and, based on the detection, changing an operating speed of the circuit or the level of work. In addition, in order to minimize the power consumption of the semiconductor circuit, a method is described herein for dynamically detecting and utilizing the power consumed by the semiconductor circuit.

A system-on-chip according to an aspect of the inventive concept includes: a dynamic power monitor configured to generate a power detection signal by calculating an amount of power consumed by a functional circuit in real time; a frequency controller configured to detect an idle period and a running period of the functional circuit in response to the power detection signal, and generate a clock control signal based on the power detection signal; and a clock controller configured to change a frequency of a clock signal provided to the functional circuit, based on the clock control signal. The running period includes: a first running period in which the frequency of the clock signal has a first value based on the clock control signal; and a second running period in which the frequency of the clock signal has a second value that is greater than the first value based on the clock control signal.

A system-on-chip according to another aspect of the inventive concept includes: a dynamic power monitor configured to generate a power detection signal by calculating power consumed by a functional circuit; a frequency controller configured to generate a clock control signal in response to the power detection signal; and a clock controller configured to change a frequency of a clock signal based on the clock control signal, and transmit the clock signal with a changed frequency to the functional circuit, wherein the frequency controller includes: a comparison block configured to generate a comparison signal by comparing the power detection signal with a reference power level; and a waiting counter configured to generate a wait signal by extending a period of the comparison signal in a first level, wherein the extension is based on an input counting value.

An operating method of a system-on-chip according to another aspect of the inventive concept includes: generating a value of power consumed by a functional circuit as a power detection signal; generating a comparison signal by comparing a reference power level with the power detection signal; generating a wait signal by extending a period of the comparison signal in a first level, wherein the extension is based on an input counting value; and changing a frequency of a clock signal provided to the functional circuit, based on the wait signal.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Figure 1:
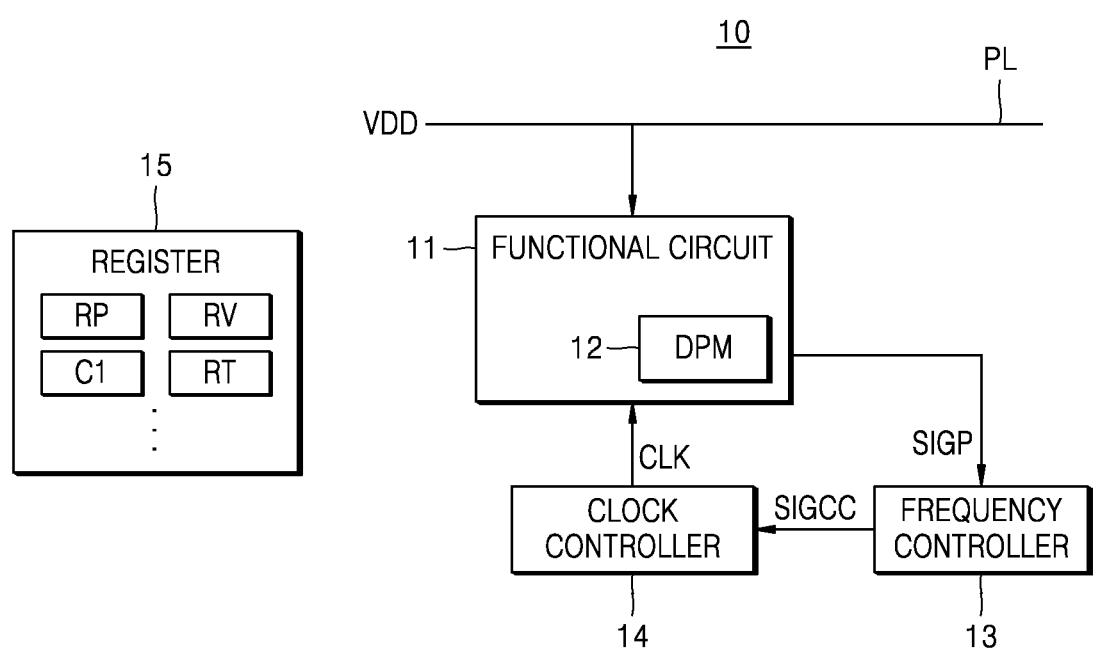
FIG. 1 is a block diagram that illustrates a system-on-chip according to an example embodiment.

Hereinafter, various embodiments of the inventive concept will be described with reference to the accompanying drawings. Like reference symbols in the drawings may denote like elements, and to the extent that a description of an element has been omitted, it may be understood that the element is at least similar to corresponding elements that are described elsewhere in the specification.

FIG. 1 is a block diagram that illustrates a system-on-chip 10 according to an example embodiment.

Referring to FIG. 1, the system-on-chip 10 may include a functional circuit 11, a dynamic power monitor (DPM) 12, a frequency controller 13, a clock controller 14, and a register 15.

The system-on-chip 10 may include one or more of the following: an application processor (AP), a central processing unit (CPU), a graphics processing unit (GPU), a neural processing unit (NPU), a digital signal processor (DSP), an image signal processor (ISP), and the like.

The functional circuit 11 may be configured to perform a predetermined function for an operation of the system-on-chip 10. The functional circuit 11 may be supplied with a power voltage VDD through a power line PL. The functional circuit 11 may operate based on the power voltage VDD and a clock signal CLK. The functional circuit 11 may perform a plurality of operations. The functional circuit 11 may include at least one processing element or processor core for processing data. The functional circuit 11 may include circuits (for example, an interface circuit, a cache memory, a data input/output buffer, and the like) for providing data to the processing element or receiving data output by the processing element.

In an embodiment, the functional circuit 11 may include at least one of a plurality of functional blocks such as a display control block, a file system block, a graphics processing block, an image signal processing block, a multi-format codec block, and the like, which are each distinguished by their respective unique functions.

The functional circuit 11 may include the dynamic power monitor DPM 12 (Hereinafter, the dynamic power monitor is referred to as DPM). The DPM 12 may be a circuit for monitoring power of the functional circuit 11. The DPM 12 may monitor power of the system-on-chip 10. The DPM 12 may be implemented by hardware within the functional circuit 11. The DPM 12 may receive the power voltage VDD and the clock signal CLK, and may operate based on the received power voltage VDD and clock signal CLK. The DPM 12 may calculate power consumed by the functional circuit 11 in real time according to a cycle of the clock signal CLK. In an embodiment, when the functional circuit 11 is a core of a CPU, the cycle of the clock signal CLK may refer to a CPU cycle. The DPM 12 may provide a monitoring result of the power consumed by the functional circuit 11 to the frequency controller 13 as a power detection signal SIGP. The power detection signal SIGP may include power information, for example, a value of the power consumed by the functional circuit 11. The DPM 12 will be described in detail later with reference to FIG. 16.

The frequency controller 13 may receive the power detection signal SIGP and generate a clock control signal SIGCC. The frequency controller 13 may generate a comparison signal having a second level when a power level of the power detection signal SIGP is higher than a reference power level RP, and may generate a wait signal obtained by delaying a first level of the comparison signal by an input counting value C1. The first level may be either a high level or a low level. In most of the embodiments described herein, the first level is described as the high level, and the second level is described as the low level, but embodiments are not necessarily limited thereto. In another embodiment, the first level may be the low level, and the second level may be the high level. The frequency controller 13 will be described in detail later with reference to FIGS. 2 and 5.

The clock controller 14 may generate the clock signal CLK, and may modulate the clock signal CLK based on the clock control signal SIGCC. For example, the clock controller 14 may control a frequency of the clock signal CLK based on the clock control signal SIGCC. The clock controller 14 may control the frequency of the clock signal CLK, and may set the clock signal CLK to be low when the clock control signal SIGCC has the first level, and may restore the frequency of the clock signal CLK (e.g., set the clock signal CLK back to a higher value) when the clock control signal SIGCC has the second level.

The clock controller 14 may control the frequency of the clock signal CLK based on a ramp-up time RT received from the register 15. For example, the clock controller 14 may gradually increase the frequency of the clock signal CLK during the ramp-up time RT. The clock controller 14 may provide the clock signal CLK to the functional circuit 11. The functional circuit 11 may operate in response to the clock signal CLK.

The register 15 may store various information necessary for driving the system-on-chip 10. The register 15 may be able to store multiple values. For example, the register 15 may store the reference power level RP, a reference voltage level RV, the input counting value C1, the ramp-up time RT, and the like. The register 15 may be connected to each component of the system-on-chip 10, and may transmit the information stored in the register 15 to each component of the system-on-chip 10. For example, the register 15 may transmit the reference power level RP and the input counting value C1 to the frequency controller 13. The register 15 may be controlled through software outside the functional circuit 11. The information stored in the register 15 may be modified by a user of the system-on-chip 10. The information stored in the register 15 may be optimized through machine learning.

Figure 2:
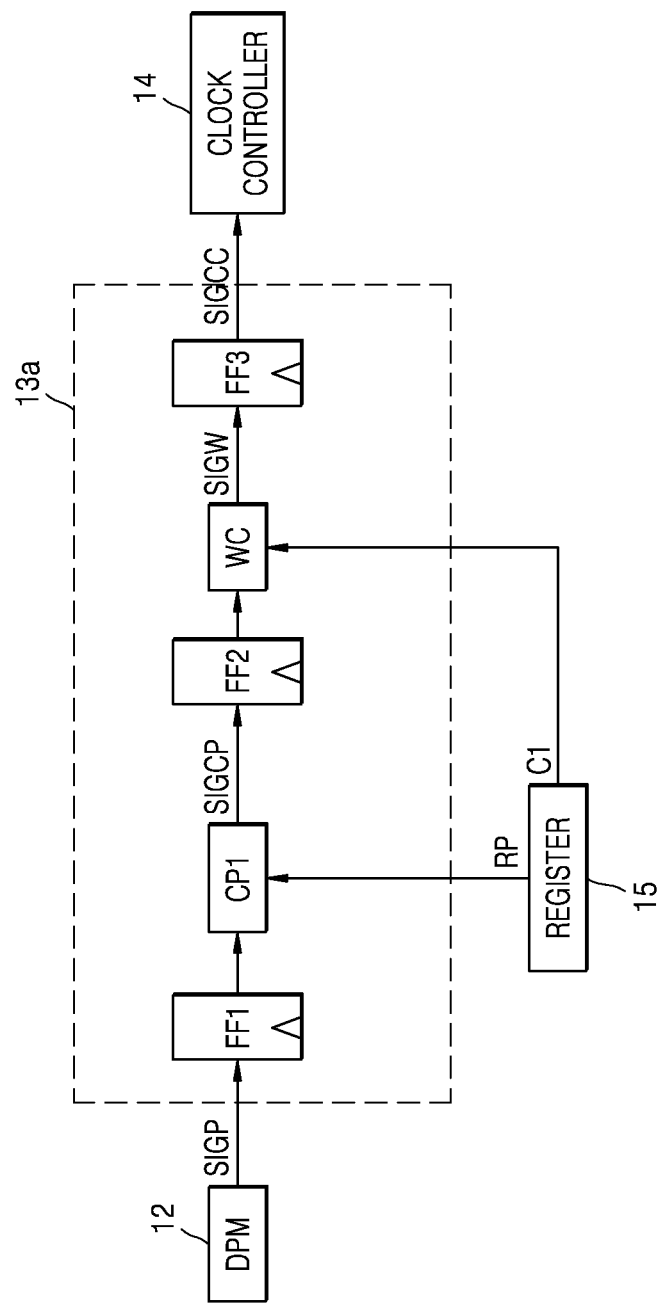
FIG. 2 is a block diagram that illustrates a frequency controller according to an example embodiment.

FIG. 2 is a block diagram that illustrates a frequency controller 13a according to an example embodiment. In detail, FIG. 2 is a block diagram that illustrates an example of the frequency controller 13 of FIG. 1. FIG. 2 will be described with reference to FIG. 1.

Referring to FIG. 2, the frequency controller 13a may include first to third flip-flops FF1 to FF3, a first comparator CP1, and a waiting counter WC.

Each of the first to third flip-flops FF1 to FF3 may delay and output a received signal. The "flip-flops" may be a circuit capable of storing and releasing a signal or state of a signal. For example, each of the first to third flip-flops FF1 to FF3 may delay the received signal by one clock cycle. The term "one clock cycle" may refer to a period between a point in time at which a clock signal transitions from the first level to the second level and a point in time at which the clock signal transitions again from the first level to the second level. The present embodiment shows all of the first to third-flops FF1 to FF3, but embodiments are not necessarily limited thereto, and the flip-flops may be selectively omitted.

The frequency controller 13a may receive the power detection signal SIGP output by the dynamic power monitor DPM 12. The first flip-flop FF1 may receive and store the power detection signal SIGP, and may output the power detection signal SIGP to the first comparator CP1. In an embodiment where the first flip-flop FF1 is omitted, the first comparator CP1 may receive the power detection signal SIGP directly from the DPM 12.

The first comparator CP1 may compare the reference power level RP input by the register 15 with the power detection signal SIGP to detect an idle period and a running period of the functional circuit 11. For example, the first comparator CP1 may recognize a period as the idle period when the power detection signal SIGP is lower than the reference power level RP, and may recognize the period as the running period when the power detection signal SIGP is higher than the reference power level RP. The reference power level RP may be set in various ways, for example, by the user.

The first comparator CP1 may compare the reference power level RP input from the register 15 with the power detection signal SIGP to generate a comparison signal SIGCP. For example, the first comparator CP1 may have the first level when the power detection signal SIGP is lower than the reference power level RP, and may have the second level when the power detection signal SIGP is higher than the reference power level RP. For example, the comparison signal SIGCP may have the first level, which may be a higher level, in the idle period, and may have the second level, which may be a lower level, in the running period. The comparison signal SIGCP may be stored in the second flip-flop FF2 and then transmitted to the waiting counter WC. In an example where the second flip-flop FF2 is omitted, the waiting counter WC may receive the comparison signal SIGCP directly from the first comparator CP1. Components necessary for generating the comparison signal SIGCP may be referred to as a comparison block. In the present embodiment, the first comparator CP1 may be included in the comparison block.

The waiting counter WC may receive the input counting value C1 from the register 15. The waiting counter WC may generate a wait signal SIGW obtained by extending the first level period of the comparison signal SIGCP by the input counting value C1. Accordingly, a length of a first level period of the wait signal SIGW may be adjusted by controlling the input counting value C1. The input counting value C1 may be an integer value. The input counting value C1 may be set in various ways by the user. The waiting counter WC may be implemented by using at least one of an AND gate, an OR gate, a NOR gate, and an inverter. Operations of the waiting counter WC will be described below with reference to FIG. 4.

The third flip-flop FF3 may receive and store the wait signal SIGW, and may transmit the wait signal SIGW to the clock controller 14. An output signal of the third flip-flop FF3 may be referred to as the clock control signal SIGCC. In an embodiment where the third flip-flop FF3 is omitted, the wait signal SIGW may be transmitted to the clock controller 14 as the clock control signal SIGCC. Hereinafter, operations of the frequency controller 13a will be described in detail with reference to FIG. 3.

Figure 3:
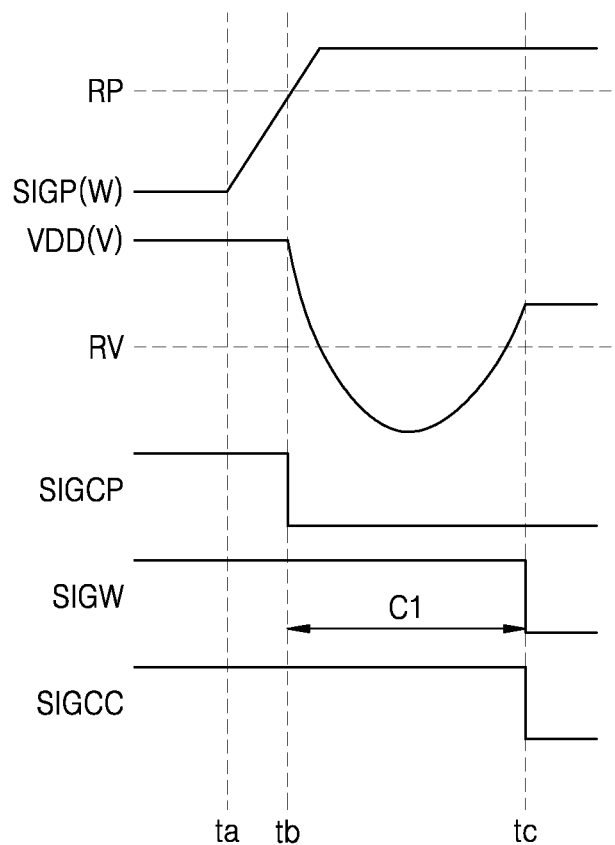
FIG. 3 is a diagram that illustrates operations of a frequency controller, according to an example embodiment.

FIG. 3 is a diagram that illustrates operations of a frequency controller, according to an example embodiment. In detail, FIG. 3 is a diagram that illustrates the operations of the frequency controller 13a of FIG. 2. For convenience of description, the frequency controller 13a with the first to third flip-flops FF1 to FF3 omitted will be described, and FIG. 3 will be described with reference to FIGS. 1 and 2.

Referring to FIG. 3, at a first point in time ta, a power level of the power detection signal SIGP may be lower than the reference power level RP.

The first comparator CP1 may compare the power detection signal SIGP with the reference power level RP to output the comparison signal SIGCP. The comparison signal SIGCP may have the first level when a level of the power detection signal SIGP is lower than the reference power level RP, and may have the second level when the level of the power detection signal SIGP reaches or is higher than the reference power level RP. Accordingly, because the level of the power detection signal SIGP is lower than the reference power level RP during a period from the first point in time ta to a second point in time tb, the comparison signal SIGCP may have the first level.

The first comparator CP1 may detect a running period and an idle period of the functional circuit 11 based on the comparison signal SIGCP. The first comparator CP1 may detect a period in which the comparison signal SIGCP has the first level as the idle period, and may detect a period in which the comparison signal SIGCP has the second level as the running period. Accordingly, a period before the second point in time tb may be detected as the idle period.

At the second point in time tb, the level of the power detection signal SIGP may be at or higher than the reference power level RP. Accordingly, the comparison signal SIGCP may transit from the first level to the second level, and the first comparator CP1 may detect a period after the second point in time tb as the running period. In an embodiment, as the functional circuit 11 consumes power, a voltage level of the power voltage VDD provided to the functional circuit 11 may decrease. During a period from the second point in time tb to a third point in time tc, the voltage level of the power voltage VDD may become less than the reference voltage level RV and then increase again to reach a voltage above the reference voltage level RV within the period from the second point in time tb to the third point in time tc.

The waiting counter WC may generate the wait signal SIGW by extending the first level period of the comparison signal SIGCP by the input counting value C1. For example, a period of the wait signal SIGW at a first level may be the sum of a period of the comparison signal SIGCP at the first level and another period determined by the input counting value C1. Accordingly, the wait signal SIGW may have the first level period longer than that of the comparison signal SIGCP by the input counting value C1. The input counting value C1 may refer to the number of clock cycles as set by the user. In the present embodiment, the input counting value C1 may refer to the number of clock cycles corresponding to the period from the second point in time tb to the third point in time tc. In an example, the input counting value C1 may be set such that the first level period of the wait signal SIGW is maintained until after the third point in time tc. The operations of the waiting counter WC will be described below with reference to FIG. 4.

In this way, the frequency controller according to the present embodiment may generate the clock control signal SIGCC in response to the power detection signal SIGP. The clock signal CLK, which will be described more later, will be modulated based on the clock control signal SIGCC.

Because the present embodiment describes a case in which the third flip-flop FF3 is omitted, the wait signal SIGW may refer to the clock control signal SIGCC. In another embodiment, when the third flip-flop FF3 transfers signals between the waiting counter WC and the clock controller 14, the clock control signal SIGCC may refer to a signal obtained by delaying a transmission time of the wait signal SIGW.

Figure 4:
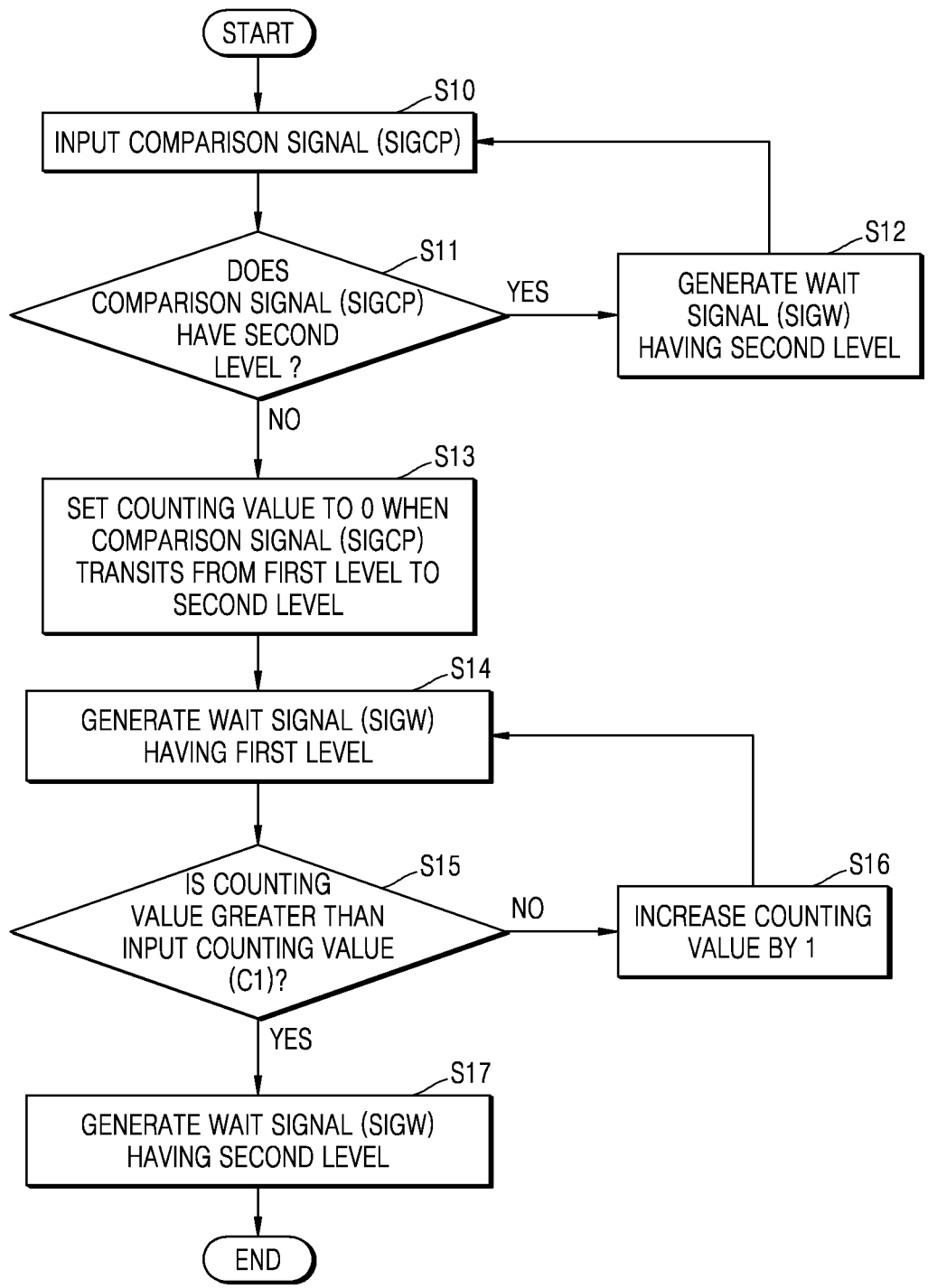
FIG. 4 is a flowchart that illustrates operations of a waiting counter, according to an example embodiment.

FIG. 4 is a flowchart that illustrates operations of a waiting counter, according to an example embodiment. In detail, FIG. 4 is a flowchart that illustrates the operations of the waiting counter WC of FIG. 2. As will be discussed later, the wait signal SIGW output from the waiting counter WC will ultimately determine the frequency CLKF of the system; for example, a first level SIGW signal will maintain the system at a low frequency CLKF, and a second level SIGW signal will increase the frequency CLKF to a high frequency. Waiting counters included in other embodiments to be described below may operate as shown in FIG. 4. For convenience of description, the frequency controller 13a with the first to third flip-flops FF1 to FF3 omitted will be described, and FIG. 4 will be described with reference to FIGS. 1 and 2.

Referring to FIG. 4, in operation S10, the waiting counter WC may receive the comparison signal SIGCP from the comparison block.

In operation S11, the waiting counter WC may detect a level of the comparison signal SIGCP. When the level of the comparison signal SIGCP is the second level, corresponding to a 'running' level of power use below the reference power level, according to operation S12, the wait signal SIGW having the second level may be output. When the level of the comparison signal SIGCP is the first level, indicating an 'idle' level of power use below the reference power level, according to operation S13, the wait signal SIGW having the first level may be output and a counting value may be set to 0 as the comparison signal SIGCP transitions from the first level to the second level (for example, at the time point tb of FIG. 3). The counting value may refer to the number of repetitions of a clock cycle. Even if the comparison signal SIGCP having the second level is output from the comparison block, the output time of the wait signal SIGW having the first level may be extended according to the counting value.

In operation S14, when the level of the comparison signal SIGCP is the first level, the waiting counter WC may output the wait signal SIGW having the first level.

In operation S15, the waiting counter WC may compare the counting value with the input counting value C1 input from the register 15. When the counting value is less than the input counting value C1, according to operation S16, the counting value may be increased by 1. According to operation S15, the waiting counter WC may maintain the output of the wait signal SIGW at the first level until the counting value becomes greater than the input counting value C1. That is, the waiting counter WC may generate the wait signal SIGW at the first level for an additional number of clock cycles input by the input counting value C1. According to operation S17, the wait signal SIGW may transition from the first level to the second level when the counting value is greater than the input counting value C1. For example, the wait signal SIGW may be held at the first level for an additional number of clock cycles input by the counting value C1, until at which point the wait signal SIGW is generated at the second level. In this way, the waiting counter WC may generate the wait signal SIGW in response to the comparison signal SIGCP and the input counting value C1.

Figure 5:
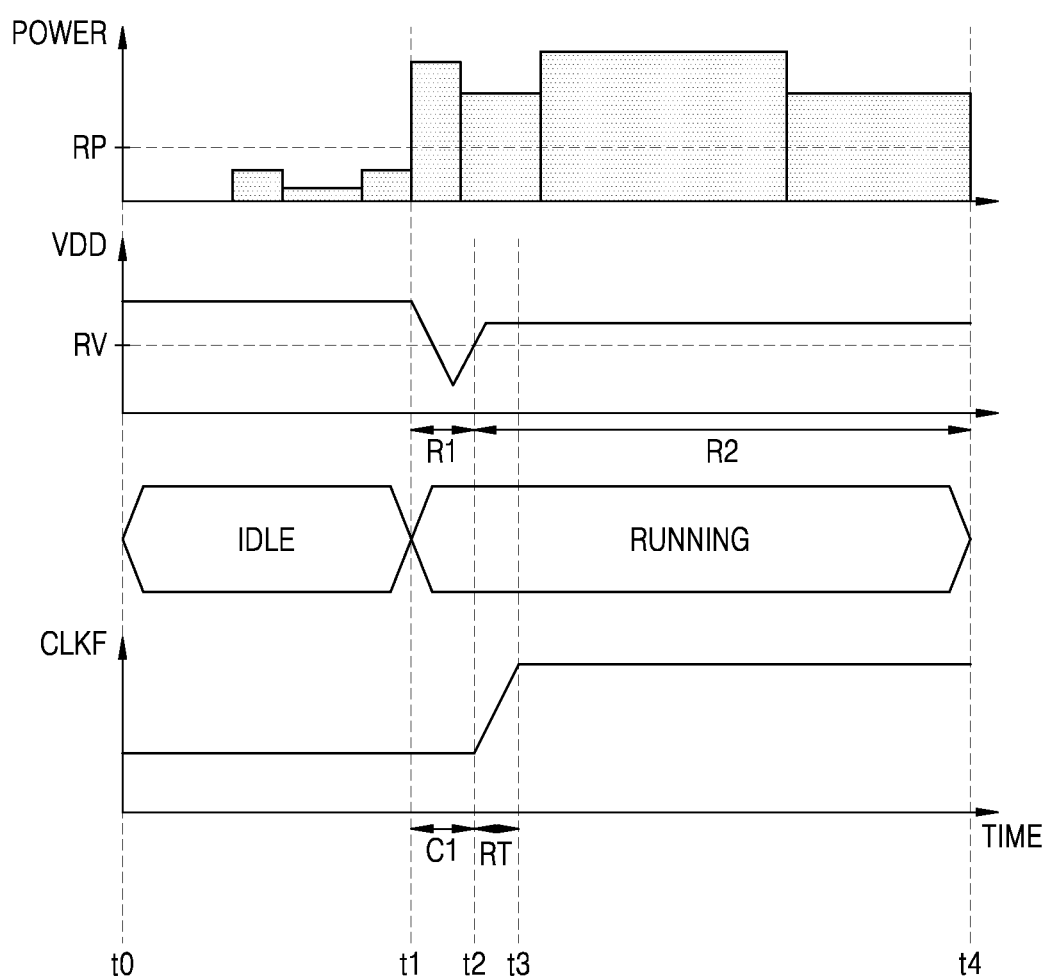
FIG. 5 is a diagram that illustrates operations of a system-on-chip, according to an example embodiment.

FIG. 5 is a diagram that illustrates operations of a system-on-chip, according to an example embodiment. In detail, FIG. 5 is a diagram that illustrates operations of the system-on-chip 10 of FIG. 1. FIG. 5 will be described with reference to FIGS. 1 to 3. A first point in time t1 of FIG. 5 may correspond to the second point in time tb of FIG. 3, and a second point in time t2 of FIG. 5 may correspond to the third point in time tc of FIG. 3.

Referring to FIG. 5, the power level of the power consumed by the functional circuit 11 may be lower than the reference power level RP during a period from a zero point in time t0 to the first point in time t1. Accordingly, the power voltage VDD may supplied to the functional circuit 11. As used herein, "stably" may describe a signal or voltage that is provided at an expected or relatively constant value, or above a certain reference value. For example, the power voltage VDD may be supplied to the functional circuit 11 at a substantially constant level before the first point in time t1. The first comparator CP1 may output the comparison signal SIGCP having the first level in the period from the zero point in time t0 to the first point in time t1, and this period may be detected as an idle period. Because the comparison signal SIGCP has the first level, the clock control signal SIGCC may have the first level. Accordingly, in the period from the zero point in time t0 to the first point in time t1, a frequency CLKF of a clock signal may be set relatively low.

During a period from the first point in time t1 to a fourth point in time t4, the power level of the power consumed by the functional circuit 11 may be higher than the reference power level RP. Accordingly, a droop (voltage drop) in the power voltage VDD may occur in the functional circuit 11.

The first comparator CP1 may output the comparison signal SIGCP having the second level in the period from the first point in time t1 to the fourth point in time t4, and this period may be detected as a running period.

During a period from the first point in time t1 to the second point in time t2, the wait signal SIGW obtained by extending the first level period of the comparison signal SIGCP by the input counting value C1 may be provided by the waiting counter WC. Accordingly, even when the comparison signal SIGCP has the second level in the period from the first point in time t1 to the second point in time t2, because the wait signal SIGW has the first level in the period from the first point in time t1 to the second point in time t2, the clock control signal SIGCC may have the first level. In response, the frequency CLKF of the clock signal may be still be set relatively low in the period from the first point in time t1 to the second point in time t2.

In the running period, a period in which the frequency CLKF of the clock signal is controlled to be relatively low may be referred to as a first running period R1. In the present embodiment, the period from the first point in time t1 to the second point in time t2 may be referred to as the first running period R1.

At the second point in time t2, the voltage level of the power voltage VDD may be higher than the reference voltage level RV. For example, the power voltage VDD may be stably provided to the functional circuit 11. During a period from the second point in time t2 to the fourth point in time t4, because the comparison signal SIGCP and the wait signal SIGW have the second level, the clock control signal SIGCC may have the second level. Accordingly, the frequency CLKF of the clock signal may set to be relatively high.

In an embodiment, the clock controller 14 may control the frequency CLKF of the clock signal based on the ramp-up time RT received from the register 15. For example, the clock controller 14 may gradually increase the frequency CLKF of the clock signal during the ramp-up time RT.

Accordingly, the frequency CLKF of the clock signal may be gradually increased from the second point in time t2 to a third point in time t3. The ramp-up time RT may be set in various ways by the user.

The running period during which the frequency CLKF of the clock signal is controlled to be relatively high may be referred to as a second running period R2. In the present embodiment, the period from the second point in time t2 to the fourth point in time t4 may be referred to as the second running period R2.

According to the inventive concept, the frequency CLKF of the clock signal may be controlled to be relatively low in the idle period and the first running period R1 of the functional circuit 11, and the frequency CLKF of the clock signal may be controlled to be relatively high in the second running period R2 of the functional circuit 11, and thus, the droop in the power voltage VDD may be lessened. In addition, because unnecessary power consumption may be reduced, and noise may be reduced, the operations of the system-on-chip 10 may be stably performed.

In a comparative example, a system-on-chip may experience an increase in power usage in response to a "running state", which may cause a simultaneous supply voltage droop and an increase in system-clock speed to meet the demands of the user. The sudden increase in system-clock speed may exacerbate the supply voltage droop, and accordingly the supply voltage droop may be very large. To compensate, a system-on-chip in the comparative example may maintain a very high supply voltage, which results in an inefficient use of power.

In an embodiment system-on-chip according to the present inventive concepts, a sudden increase in power may similarly cause a droop in the supply voltage to the functional circuit thereon. However, because the system-on-chip according to the present inventive concepts detects the voltage droop before the supply voltage reaches its minimum, the system-on-chip may delay an increase in system clock frequency to allow the supply voltage to stabilize. In this way, the supply voltage may increase to a stable value above the reference value before the system clock frequency increases to match system demand, thereby preventing an unstable supply voltage droop. Accordingly, a system-on-chip according to the present inventive concepts may run more stably, and does not have to provide an overly large supply voltage for compensation, and may therefore use power more efficiently.

Figure 6:
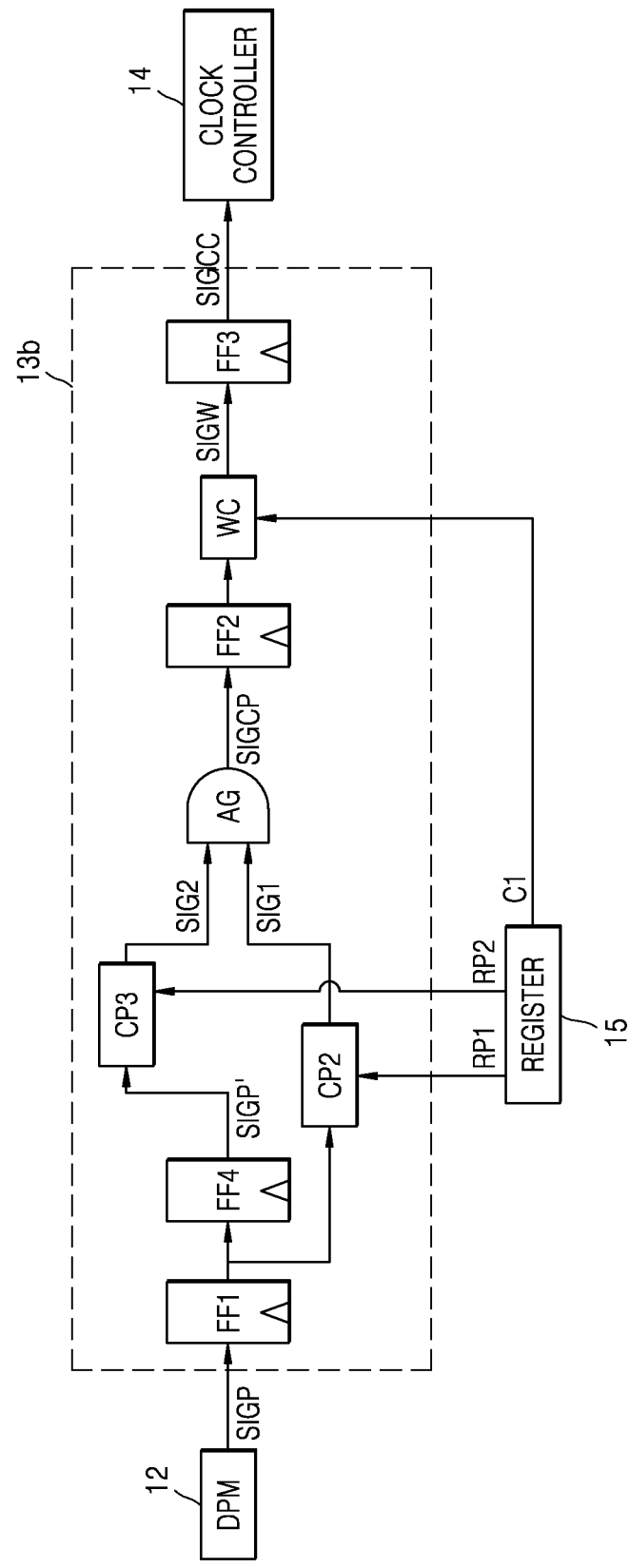
FIG. 6 is a block diagram that illustrates a system-on-chip according to an example embodiment.

FIG. 6 is a block diagram that illustrates a system-on-chip according to an example embodiment. In detail, FIG. 6 is a block diagram that illustrates an example of the frequency controller 13 of FIG. 1. Hereinafter, FIG. 6 will be described with reference to FIGS. 1 and 2, and descriptions previously given with reference to FIG. 2 will be omitted.

Referring to FIG. 6, a frequency controller 13b may include first to fourth flip-flops FF1 to FF4, second and third comparators CP2 and CP3, an AND gate AG, and the waiting counter WC.

Each of the first to fourth flip-flops FF1 to FF4 may delay and output a received signal. For example, each of the first to fourth flip-flops FF1 to FF4 may delay the received signal by one clock cycle. In the embodiment described herein with reference to FIG. 6, the first to third flip-flops FF1 to FF3 may be selectively omitted.

The frequency controller 13b may receive the power detection signal SIGP output by the DPM 12. The first flip-flop FF1 may receive and store the power detection signal SIGP, and may output the power detection signal SIGP to the second comparator CP2 and the fourth flip-flop FF4. When the first flip-flop FF1 is omitted, the second comparator CP2 and the fourth flip-flop FF4 may receive the power detection signal SIGP from the DPM 12.

The second comparator CP2 may compare a first reference power level RP1 input from the register 15 with the power detection signal SIGP to detect an idle period and a running period of the functional circuit 11. For example, the second comparator CP2 may recognize a period as the idle period when the power detection signal SIGP is lower than the first reference power level RP1, and may recognize the period as the running period when the power detection signal SIGP is higher than the first reference power level RP1.

The second comparator CP2 may compare the first reference power level RP1 with the power detection signal SIGP to generate a first internal signal SIG1. For example, the first internal signal SIG1 may have the second level in the idle period, and may have the first level in the running period. As used herein, the first level may be described as having a higher level than a second level. The first internal signal SIG1 may be transmitted to the AND gate AG.

The third comparator CP3 may receive an output signal from the fourth flip-flop FF4. Accordingly, the third comparator CP3 may receive the power detection signal SIGP one clock cycle later than the second comparator CP2. The delayed power detection signal SIGP that is input to the third comparator CP3 may be referred to as a power delay signal SIGP'.

The third comparator CP3 may compare a second reference power level RP2 input from the register 15 with the power delay signal SIGP' to generate a second internal signal SIG2. For example, the second internal signal SIG2 may have the second level when the power delay signal SIGP' is higher than the second reference power level RP2, and may have the first level when the power delay signal SIGP' is lower than the second reference power level RP2. The second internal signal SIG2 may be transmitted to the AND gate AG. The first and second reference power levels RP1 and RP2 may be set in various ways by the user. For example, the first and second reference power levels RP1 and RP2 may be configured before the system-on-chip operates, or they may be configured during operation. The first and second reference power levels RP1 and RP2 may be identical levels. In another embodiment, the first and second reference power levels RP1 and RP2 may be different levels.

The AND gate AG may receive and combine the first internal signal SIG1 with the second internal signal SIG2. The AND gate AG may output the comparison signal SIGCP based on the first internal signal SIG1 and the second internal signal SIG2. The comparison signal SIGCP may have the second level when at least one of the first internal signal SIG1 and the second internal signal SIG2 has the second level. That is, the comparison signal SIGCP may have the first level when both the first internal signal SIG1 and the second internal signal SIG2 have the first level. However, if one of the first internal signal SIG1 or the second internal signal SIG2 has the second level, then the comparison signal SIGCP may have the second level; in this way, the second level signal may be analogous to a '0' value when applied to the AND gate AG. The comparison signal SIGCP may be stored in the second flip-flop FF2 and then transmitted to the waiting counter WC. When the second flip-flop FF2 is omitted, the waiting counter WC may receive the comparison signal SIGCP from the first comparator CP1.

Components necessary for generating the comparison signal SIGCP may be referred to as a comparison block. In the present embodiment, the fourth flip-flop FF4, the second comparator CP2, and the third comparator CP3 may be included in the comparison block.

The waiting counter WC may receive the input counting value C1 from the register 15. The waiting counter WC may generate the wait signal SIGW obtained by extending the first level period of the comparison signal SIGCP by the input counting value C1. The third flip-flop FF3 may receive and store the wait signal SIGW, and may transmit the wait signal SIGW to the clock controller 14. An output signal of the third flip-flop FF3 may be referred to as the clock control signal SIGCC. When the third flip-flop FF3 is omitted, the wait signal SIGW may be transmitted to the clock controller 14 as the clock control signal SIGCC. Hereinafter, operations of the frequency controller 13b will be described in detail with reference to FIG. 7.

Figure 7:
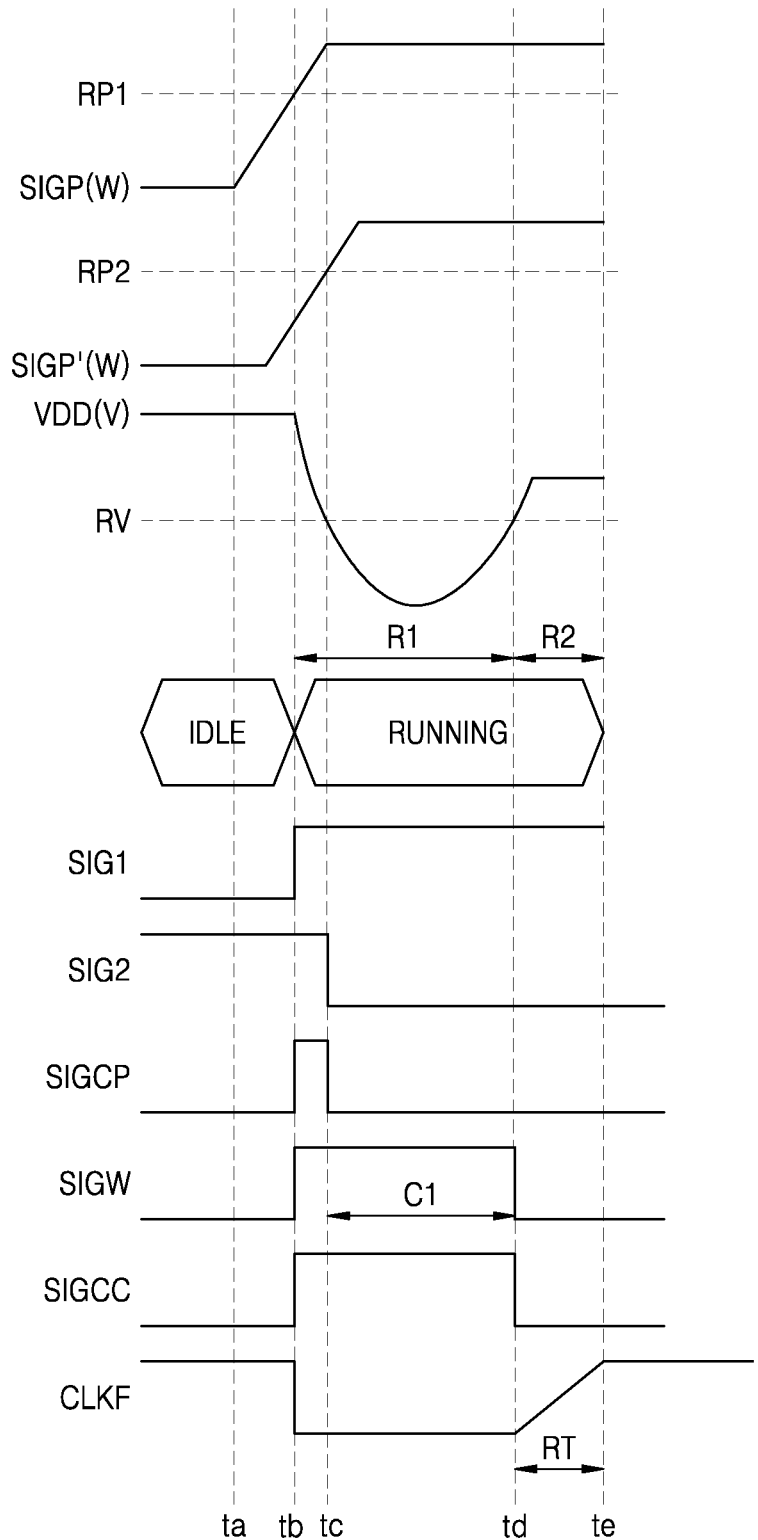
FIG. 7 is a diagram that illustrates operations of a system-on-chip, according to an example embodiment.

FIG. 7 is a diagram that illustrates operations of a system-on-chip, according to an example embodiment. In detail, FIG. 7 is a diagram that illustrates operations of a system-on-chip including the frequency controller 13b of FIG. 6. For convenience of description, the frequency controller 13b with the first to third flip-flops FF1 to FF3 omitted will be described, FIG. 7 will be described with reference to FIGS. 1 and 6, and redundant description of similar components thereof may be omitted.

Referring to FIG. 7, during a period from a first point in time ta to a second point in time tb, a level of the power detection signal SIGP may be lower than the first reference power level RP1. Accordingly, the power voltage VDD may be stably supplied to the functional circuit 11. During the period from ta to tb, the second comparator CP2 may output the first internal signal SIG1 having the second level, which, in this embodiment, may be the lower level, and this period may be detected as an idle period. Because the comparison signal SIGCP is calculated by the AND gate AG, as the first internal signal SIG1 has the second level (which may correspond to a '0' value for a generic AND gate), the comparison signal SIGCP may have the second level. Accordingly, the clock control signal SIGCC may have the second level, and thus, a frequency CLKF of a clock signal may be controlled to be relatively high in the period from the first point in time ta to the second point in time tb. For example, the frequency CLKF of the clock signal may be controlled to be relatively high in the idle period.

During a period between the second point in time tb and a fifth point in time te, a level of power consumed by the functional circuit 11 may be higher than the reference power level RP1. Accordingly, a droop (voltage drop) in the power voltage VDD may occur in the functional circuit 11.

The second comparator CP2 may output the first internal signal SIG1 having the first level (which, in this embodiment, may be the higher level) in the period between the second point in time tb and the fifth point in time te, and this period may be detected as a running period.

At the second point in time tb, the level of the power detection signal SIGP may be higher than the first reference power level RP1. Accordingly, the second comparator CP2 may detect a period after the second point in time tb as the running period, and the first internal signal SIG1 may transition from the second level to the first level.

In the present embodiment, a period from the second point in time tb to a third point in time tc may span one clock cycle period. However, this is only an example, and embodiments are not necessarily limited thereto. The third comparator CP3 may generate the second internal signal SIG2 based on the power delay signal SIGP' received from the fourth flip-flop FF4, and the power delay signal SIGP' may be obtained by delaying the power detection signal SIGP by one clock cycle. Based on this, operations of the third comparator CP3 will be described.

At the second point in time tb, the level of the power delay signal SIGP' may be lower than the level of the power detection signal SIGP. Accordingly, at the second point in time tb, the level of the power delay signal SIGP' may be lower than the second reference power level RP2. In addition, after a third point in time tc that is one clock cycle after the second point in time tb, the level of the power delay signal SIGP' may be higher than the second reference power level RP2. Accordingly, the third comparator CP3 may output the second output signal SIG2 having the first level until the third point in time tc. In addition, the second output signal SIG2 having the second level may be output after the third point in time tc. That is, because the level of the power delay signal SIGP' is lower than the second reference power level RP2 at the second point in time tb, the second internal signal SIG2 may have the first level at the third point in time tc. Because the level of the power detection signal SIGP is higher than the second reference power level RP2 at the third point in time tc, the second internal signal SIG2 may transition from the first level to the second level at the third point in time tc. In the present embodiment, the first reference power level RP1 may be identical to the second reference power level RP2. However, embodiments are not necessarily limited thereto, and the first reference power level RP1 may be different from the second reference power level RP2.

The comparison signal SIGCP may be obtained as an output from the first internal signal SIG1 and the second internal signal SIG2 through the AND gate AG. Accordingly, the comparison signal SIGCP may have the first level in the period from the second point in time tb to the third point in time tc.

During a period from the second point in time tb to a fourth point in time td, the wait signal SIGW obtained by extending the first level period of the comparison signal SIGCP by the input counting value C1 may be provided by the waiting counter WC. Accordingly, even when the comparison signal SIGCP has the second level during a period from the third point in time tc to the fourth point in time td, the clock control signal SIGCC may maintain the first level in the period from the third point in time tc to the fourth point in time td because of the wait signal SIGW having the first level in the period from the third point in time tc to the fourth point in time td. Accordingly, in the period from the second point in time tb to the fourth point in time td, the frequency CLKF of the clock signal may be controlled to be relatively low.

In the running period, a period in which the frequency CLKF of the clock signal is controlled to be relatively low may be referred to as a first running period R1. In the present embodiment, the period from the second point in time tb to the fourth point in time td may be referred to as the first running period R1.

Because the present embodiment describes a case in which the third flip-flop FF3 is omitted, the clock control signal SIGCC may be identical to the wait signal SIGW. In another embodiment, when the third flip-flop FF3 transfers signals between the waiting counter WC and the clock controller 14, the clock control signal SIGCC may refer to a signal that is obtained by delaying a transmission time of the wait signal SIGW by one clock cycle.

At the fourth point in time td, a voltage level of the power voltage VDD may be higher than the reference voltage level RV. That is, the power voltage VDD may be stably provided to the functional circuit 11. During a period after the fourth point in time td, because the comparison signal SIGCP and the wait signal SIGW have the second level, the clock control signal SIGCC may have the second level. Accordingly, the frequency CLKF of the clock signal may be controlled to be relatively high.

During a period from the fourth point in time td to the fifth point in time te, the clock controller 14 may control the frequency CLKF of the clock signal based on the ramp-up time RT received from the register 15. For example, the clock controller 14 may gradually increase the frequency CLKF of the clock signal during the ramp-up time RT. Accordingly, the frequency CLKF of the clock signal may be gradually increased in the period from the fourth point in time td to the fifth point in time te. For example, the ramp-up time RT may allow the power voltage VDD to achieve a relatively stable value above the reference voltage level RV before reaching a full, "running" level clock speed. The ramp-up time RT may be set in various ways by the user.

In the running period, a period in which the frequency CLKF of the clock signal is controlled to be relatively high may be referred to as a second running period R2. In the present embodiment, the period after the fourth point in time td may be referred to as the second running period R2.

According to the inventive concept, the frequency CLKF of the clock signal may be controlled to be relatively low in the first running period R1 of the functional circuit 11, and the frequency CLKF of the clock signal may be controlled to be relatively high in the idle period and the second running period R2 of the functional circuit 11, and thus, the droop (voltage drop) in the power voltage VDD and unnecessary power consumption may be reduced. Accordingly, the operations of the system-on-chip 10 may be stably performed, and the system-on-chip 10 may operate with increased power efficiency.

Figure 8:
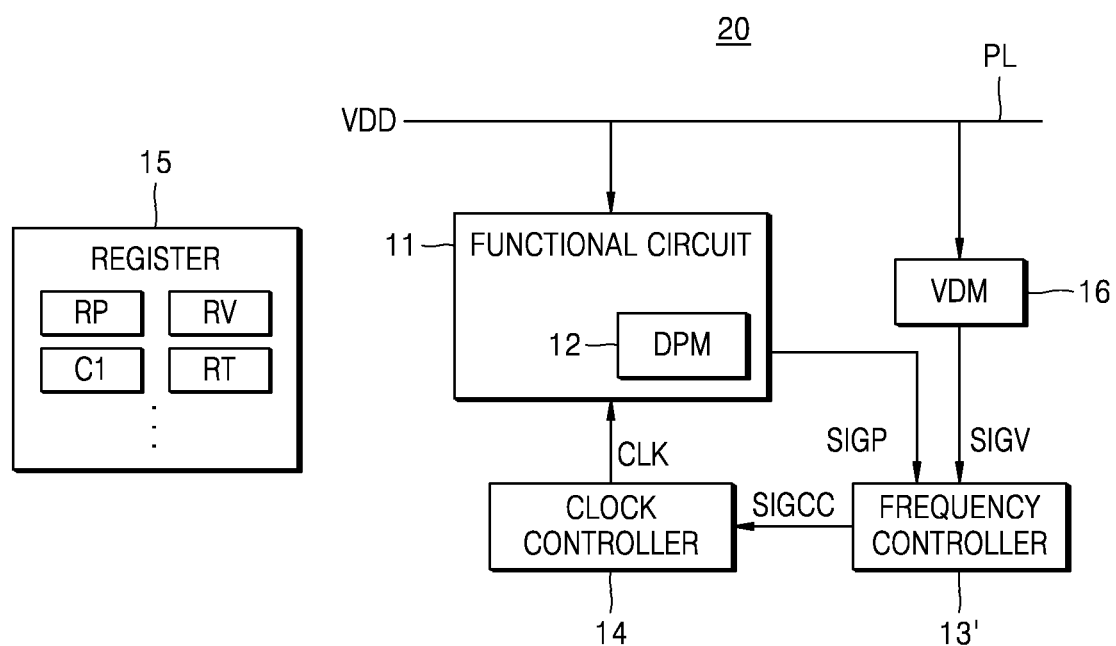
FIG. 8 is a block diagram that illustrates a system-on-chip according to an example embodiment.

FIG. 8 is a block diagram that illustrates a system-on-chip 20 according to an example embodiment. In detail, FIG. 8 illustrates another embodiment of FIG. 1, and further includes a voltage droop monitor (VDM) 16. Hereinafter, FIG. 8 will be described with reference to FIG. 1, and repeated description of similar components thereof may be omitted.

Referring to FIG. 8, the system-on-chip 20 may include the functional circuit 11, the DPM 12, a frequency controller 13', the clock controller 14, the register 15, and the VDM 16.

The VDM 16 may be supplied with the power voltage VDD through the power line PL. The VDM 16 may monitor a voltage level of the power voltage VDD to generate a voltage detection signal SIGV, and may provide the voltage detection signal SIGV to the frequency controller 13'. The voltage detection signal SIGV may have the first level when the voltage level of the power voltage VDD is higher than the reference voltage level RV, and may have the second level when the voltage level of the power voltage VDD is lower than the reference voltage level RV. The VDM 16 may include at least one comparator. The VDM 16 will be described in detail with reference to FIG. 17.

The frequency controller 13' may receive the power detection signal SIGP and the voltage detection signal SIGV to generate the clock control signal SIGCC. The clock control signal SIGCC may control the frequency of the clock signal CLK. The frequency controller 13' will be described in detail with reference to FIG. 9.

According to the inventive concept, by providing the system-on-chip 20 including the VDM 16, the frequency of the clock signal CLK may be controlled to be relatively low during a period in which the voltage level of the power voltage VDD is lower than the reference voltage level RV. Accordingly, a first level period of the clock control signal SIGCC that is provided based on the input counting value C1 of the frequency controller 13' may be supplemented. For example, by providing the system-on-chip 20 including the VDM 16, a change in the voltage level of the power voltage VDD may be handled. For example, the system-on-chip 20 including the VDM 16 may adjust its clock rate in response to either a measured change in power detection signal SIGP or in power voltage signal SIGV. Operations of the system-on-chip 20 will be described below with reference to FIGS. 10 and 11.

Figure 9:
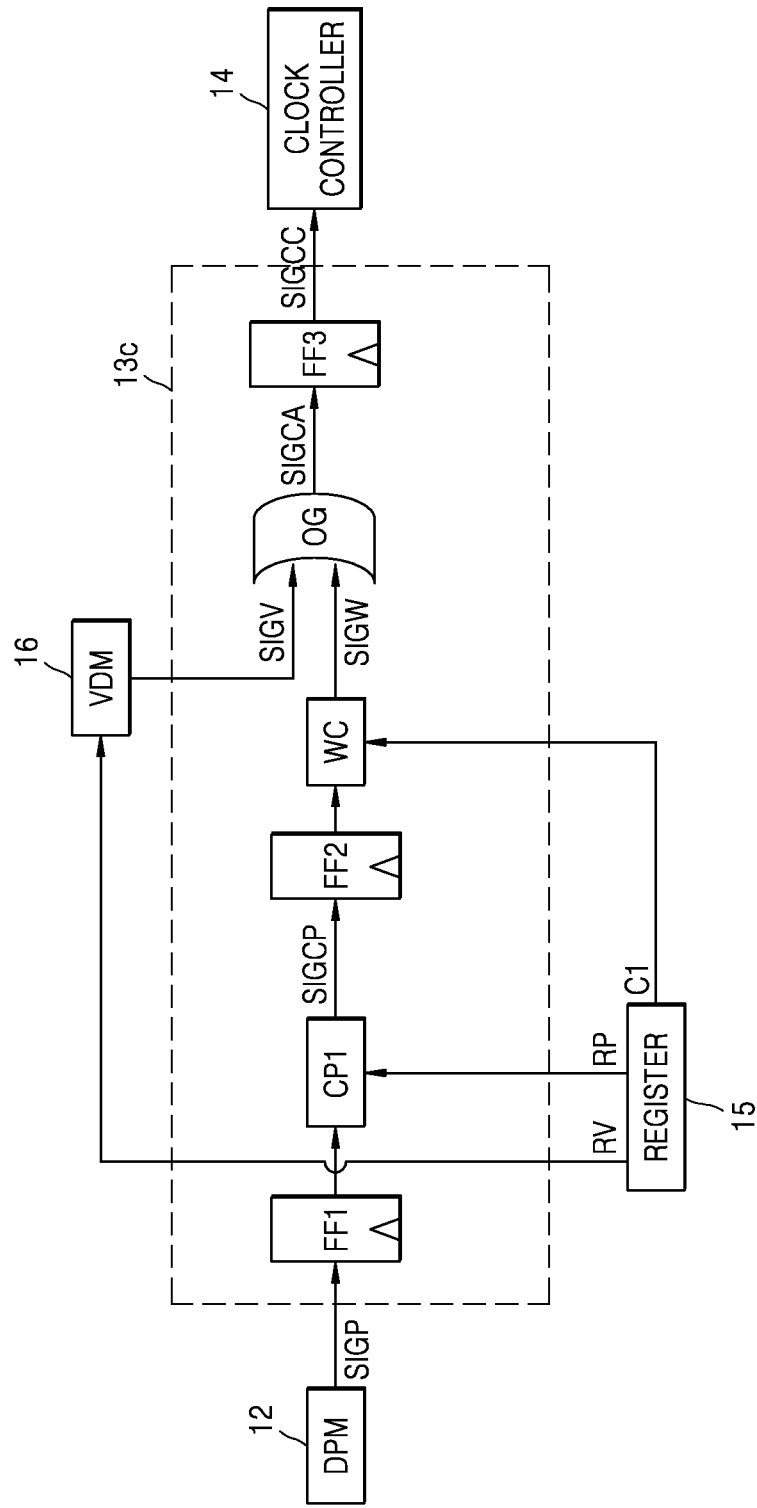
FIG. 9 is a block diagram that illustrates a semiconductor device according to an example embodiment.

FIG. 9 is a block diagram that illustrates a semiconductor device according to an example embodiment. In detail, FIG. 9 is a block diagram that illustrates an example of the frequency controller 13' of FIG. 8. Hereinafter, FIG. 9 will be described with reference to FIGS. 1 and 8, and repeated description of similar components may be omitted.

Referring to FIG. 9, a frequency controller 13c may include first to third flip-flops FF1 to FF3, a first comparator CP1, a waiting counter WC, and an OR gate OG. The first to third flip-flops FF1 to FF3, the first comparator CP1, and the waiting counter WC may have identical configurations as those of FIG. 2.

The OR gate OG may receive the voltage detection signal SIGV from the VDM 16, and may receive a wait signal SIGW from the waiting counter WC. The OR gate OG may generate a calculation signal SIGCA from the voltage detection signal SIGV and the wait signal SIGW. The calculation signal SIGCA may have the first level when either voltage detection signal SIGV, the wait signal SIGW, or both signals are at the first level. For example, the calculation signal SIGCA may have the second level when both the voltage detection signal SIGV and the wait signal SIGW are at the second level.

The third flip-flop FF3 may receive and store the calculation signal SIGCA, and may transmit the calculation signal SIGCA to the clock controller 14. An output signal of the third flip-flop FF3 may be the clock control signal SIGCC. When the third flip-flop FF3 is omitted, the calculation signal SIGCA may be transmitted to the clock controller 14 as the clock control signal SIGCC. Hereinafter, operations of the frequency controller 13c will be described in detail with reference to FIG. 10.

Figure 10:
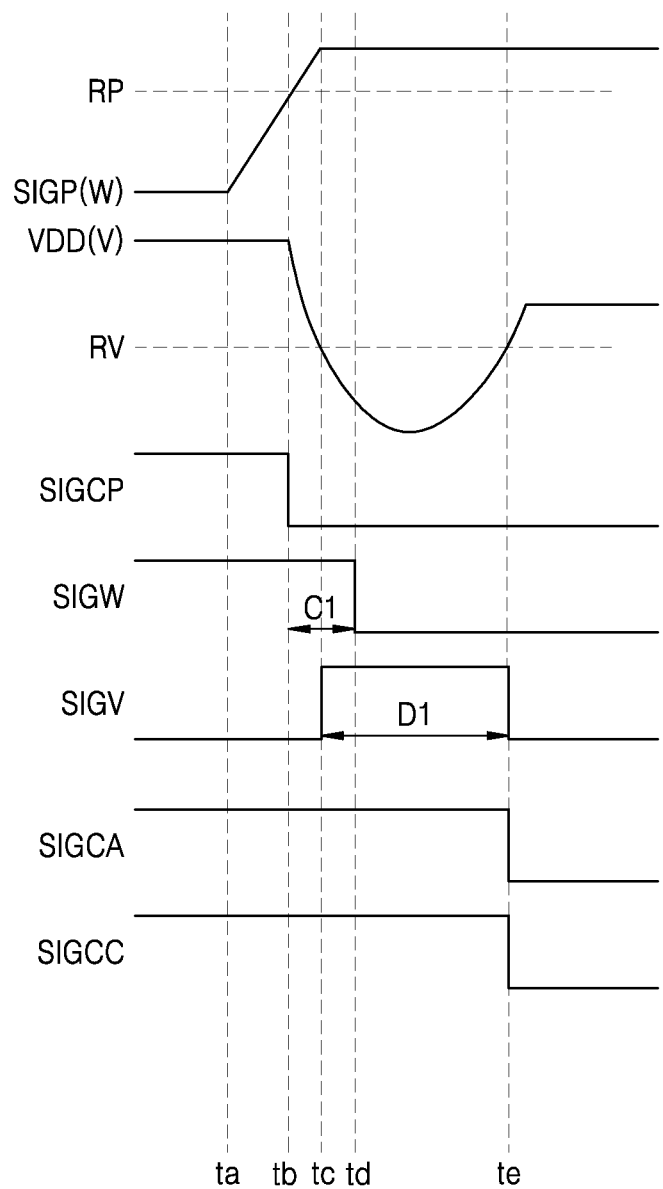
FIG. 10 is a diagram that illustrates operations of a frequency controller, according to an example embodiment.

FIG. 10 is a diagram that illustrates operations of a frequency controller, according to an example embodiment. In detail, FIG. 10 is a diagram that illustrates the operations of the frequency controller 13c of FIG. 9. For convenience of description, the frequency controller 13c with the first to third flip-flops FF1 to FF3 omitted will be described, and FIG. 10 will be described with reference to FIGS. 8 and 9.

Referring to FIG. 10, at a first point in time ta, the power level of the power detection signal SIGP may be lower than the reference power level RP.

The first comparator CP1 may compare the power detection signal SIGP with the reference power level RP to output the comparison signal SIGCP. The comparison signal SIGCP may have the first level when the level of the power detection signal SIGP is lower than the reference power level RP, and may have the second level when the level of the power detection signal SIGP is higher than the reference power level RP. Accordingly, because the level of the power detection signal SIGP is lower than the reference power level RP from the first point in time ta to a second point in time tb, the comparison signal SIGCP may have the first level during this period.

The first comparator CP1 may detect a running period and an idle period of the functional circuit 11 based on the comparison signal SIGCP. The first comparator CP1 may detect a period in which the comparison signal SIGCP has the first level as the idle period, and may detect a period in which the comparison signal SIGCP has the second level as the running period. Accordingly, the period from the first point in time ta to the second point in time tb may be detected as the idle period.

At the second point in time tb, the level of the power detection signal SIGP may be higher than the reference power level RP. Accordingly, the comparison signal SIGCP may transition from the first level to the second level at time tb, and the first comparator CP1 may detect a period after the second point in time tb as the running period. As the functional circuit 11 consumes increased power, the voltage level of the power voltage VDD provided to the functional circuit 11 may decrease.

The waiting counter WC may extend the first level period of the comparison signal SIGCP by the input counting value C1 to generate the wait signal SIGW. Accordingly, a first level period of the wait signal SIGW may be longer than that of the comparison signal SIGCP by the input counting value C1. Although the input counting value C1 may refer to the number of clock cycles corresponding to the period from the second point in time tb to a fourth point in time td, this is merely one example, and embodiments are not necessarily limited thereto.

At a third point in time tc, the voltage level of the power voltage VDD may be lower than the reference voltage level RV. Because the voltage detection signal SIGV may have the second level when the voltage level of the power voltage VDD is higher than the reference voltage level RV, and may have the first level when the voltage level of the power voltage VDD is lower than the reference voltage level RV, the voltage detection signal SIGV may transition from the second level to the first level at the third point in time tc.

At a fifth point in time te, the voltage level of the power voltage VDD may be higher than the reference voltage level RV. Accordingly, the voltage detection signal SIGV may transition from the first level to the second level. Therefore, the voltage detection signal SIGV may have the first level during a period from the third point in time tc to the fifth point in time te.

The calculation signal SIGCA may be obtained as an output from the OR gate OG, which processes the wait signal SIGW and the voltage detection signal SIGV as inputs. Accordingly, the calculation signal SIGCA may transition from the first level to the second level at the fifth point in time te, at which both the wait signal SIGW and the voltage detection signal SIGV have the second level.

Because the voltage detection signal SIGV dynamically detects a period in which the power voltage VDD is lower than the reference voltage level RV, the calculation signal SIGCA may be output by reflecting the voltage level of the power voltage VDD in real time.

Accordingly, even when the wait signal SIGW transitions from the first level to the second level before the power voltage VDD is stably provided (for example, the period from the third point in time tc to the fifth point in time te), due to the voltage detection signal SIGV, the clock control signal SIGCC may maintain the first level during a first compensation period D1. In this way, a system-on-chip according to the present disclosure may hold off on increasing the clock speed of the CPU thereon, thereby allowing power to stabilize safely. Further, this removes the need for the system-on-chip to maintain a high power voltage to compensate for droops, and allows the system-on-chip to be run at a lower voltage, thereby increasing power efficiency.

Because the present embodiment describes a case in which the third flip-flop FF3 is omitted, the calculation signal SIGCA may refer to the clock control signal SIGCC. In another embodiment, when the third flip-flop FF3 transfers signals between the waiting counter WC and the clock controller 14, the clock control signal SIGCC may refer to a signal obtained by delaying a transmission time of the calculation signal SIGCA.

Figure 11A:
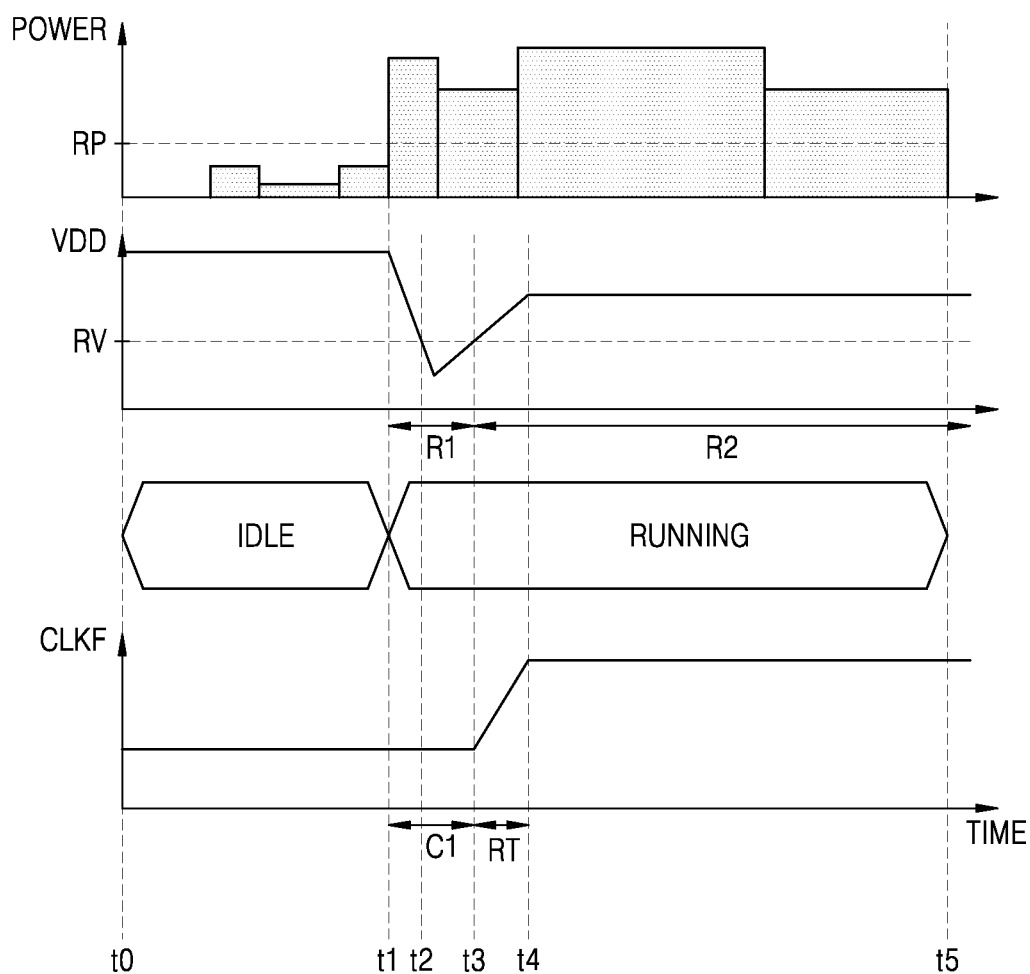
FIGS. 11A and 11B are diagrams that illustrate operations of a system-on-chip, according to example embodiments.
Figure 11B:
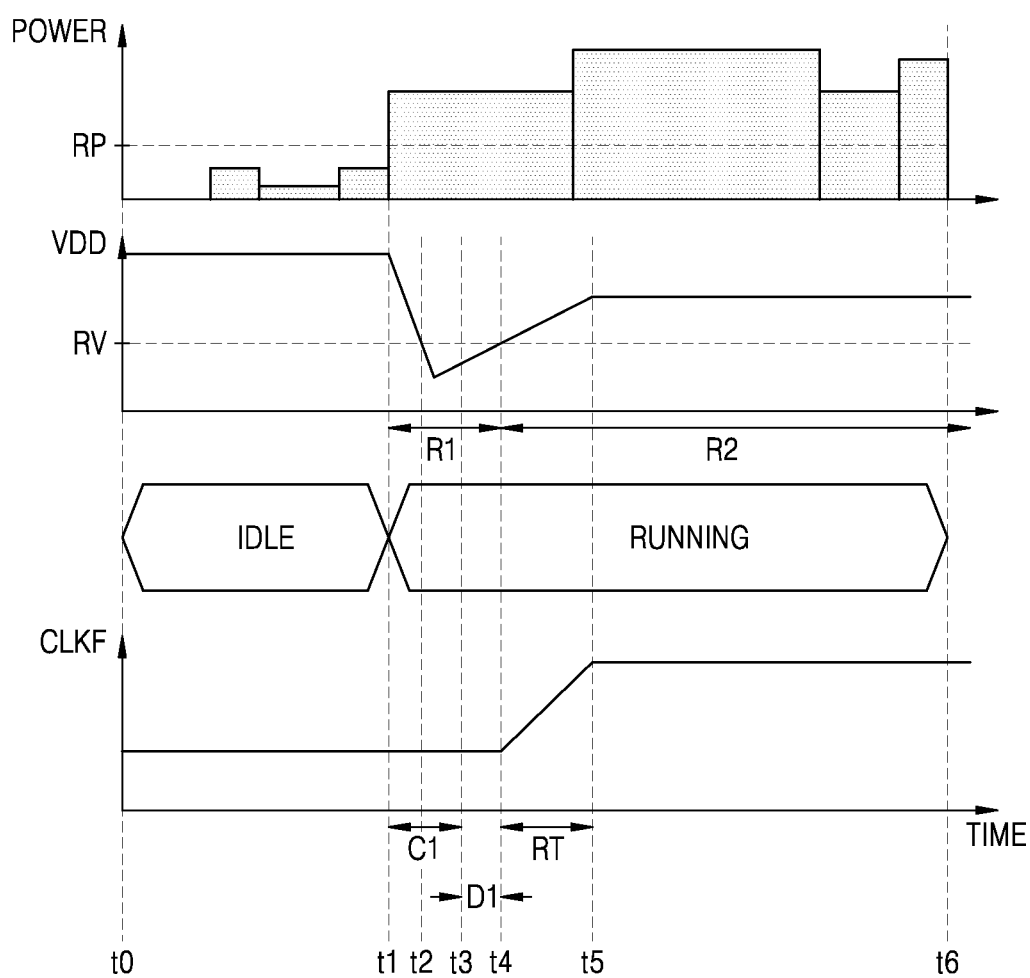

FIGS. 11A and 11B are diagrams that illustrate operations of a system-on-chip, according to example embodiments. In detail, FIGS. 11A and 11B are diagrams that illustrate the operations of the system-on-chip 20 of FIG. 8. FIGS. 11A and 11B will be described with reference to FIGS. 8 to 10.

FIG. 11A describes a case in which the voltage level of the power voltage VDD becomes lower than the reference voltage level RV during a period in which the wait signal SIGW maintains the first level, and then becomes higher than the reference voltage level RV again.

FIG. 11B describes a case in which the voltage level of the power voltage VDD becomes lower than the reference voltage level RV during the period in which the wait signal SIGW maintains the first level, and the voltage level of the power voltage VDD becomes higher than the reference voltage level RV after the wait signal SIGW transitions from the first level to the second level.

Referring to FIG. 11A, during a period from a zero point in time t0 to a first point in time t1, the power level of the power detection signal SIGP may be lower than the reference power level RP. Accordingly, the power voltage VDD may be stably supplied to the functional circuit 11. The first comparator CP1 may output the comparison signal SIGCP having the first level in the period from the zero point in time t0 to the first point in time t1. Accordingly, this period from t0 to t1 may be detected as an idle period. Because the comparison signal SIGCP has the first level, the clock control signal SIGCC may have the first level. Accordingly, in the period from the zero point in time t0 to the first point in time t1, a frequency CLKF of a clock signal may be controlled to be relatively low.

During a period from the first point in time t1 to a fifth point in time t5, the power level of the power consumed by the functional circuit 11 may be higher than the reference power level RP. This is indicated by the bar chart in FIG. 11A. Accordingly, a droop (voltage drop) in the power voltage VDD may occur in the functional circuit 11. The first comparator CP1 may output the comparison signal SIGCP having the second level in the period from the first point in time t1 to the fifth point in time t5, and this period may be detected as a running period.

During a period from the first point in time t1 to a third point in time t3, the wait signal SIGW, which is obtained by extending the first level period of the comparison signal SIGCP by the input counting value C1, may be provided by the waiting counter WC. Accordingly, even when the comparison signal SIGCP has the second level in the period from the first point in time t1 to the third point in time t3, the wait signal SIGW may have the first level in the period from the first point in time t1 to the third point in time t3.

During a period from the second point in time t2 to the third point in time t3, the voltage level of the voltage detection signal SIGV may be lower than the reference voltage level RV. Accordingly, the voltage detection signal SIGV may have the first level.

Because the clock control signal SIGCC is generated by calculating the wait signal SIGW and the voltage detection signal SIGV, the clock control signal SIGCC may maintain the first level in the period from the first point in time t1 to the third point in time t3. Accordingly, the frequency CLKF of the clock signal may be controlled to be relatively low in the period from the first point in time t1 to the third point in time t3.

A period in which the frequency CLKF of the clock signal is controlled to be relatively low, which is within the running period, may be referred to as a first running period R1. In the present embodiment, the period from the first point in time t1 to the third point in time t3 may be referred to as the first running period R1.

At the third point in time t3, the voltage level of the power voltage VDD may be higher than the reference voltage level RV. Accordingly, the voltage detection signal SIGV may transition from the first level to the second level. During a period after the third point in time t3, because both the voltage detection signal SIGV and the wait signal SIGW have the second level, the calculation signal SIGCA may have the second level. Accordingly, the frequency CLKF of the clock signal may be controlled to be relatively high.

In the running period, a period in which the frequency CLKF of the clock signal is controlled to be relatively high may be referred to as a second running period R2. In the present embodiment, the period after the third point in time t3 may be referred to as the second running period R2.

During a period from the third point in time t3 to a fourth point in time t4, the frequency CLKF of the clock signal may be controlled based on the ramp-up time RT. For example, the frequency CLKF of the clock signal may be gradually increased from the second point in time t2 to the third point in time t3.

FIG. 11B describes a case similar to the case illustrated by FIG. 11A; FIG. 11B additionally includes a first compensation period D1. Referring to FIG. 11B, the power level of the power consumed by the functional circuit 11 at a first point in time t1 may be higher than the reference power level RP. Accordingly, a period from a zero point in time t0 to the first point in time t1 may be an idle period, and a period after the first point in time t1 may be a running period. The frequency CLKF of the clock signal may be controlled to be relatively low in the idle period.

During a period from the first point in time t1 to a third point in time t3, the first level of the wait signal SIGW may be maintained based on the input counting value C1.

During a period from a second point in time t2 to a fourth point in time t4, the voltage level of the power voltage VDD may be lower than the reference voltage level RV. Accordingly, the voltage detection signal SIGV may maintain the first level in the period from the second point in time t2 to the fourth point in time t4.

During a period from the first point in time t1 to the fourth point in time t4, because at least one of the wait signal SIGW and the voltage detection signal SIGV has the first level, the calculation signal SIGCA may maintain the first level (as a result of the OR gate OG). Accordingly, the clock control signal SIGCC may maintain the first level, and the frequency CLKF of the clock signal may be controlled to be relatively low. The period from the first point in time t1 to the fourth point in time t4 may be referred to as a first running period R1.

At the fourth point in time t4, the voltage level of the power voltage VDD may be higher than the reference voltage level RV. Because the voltage detection signal SIGV may have the second level during a period in which the voltage level of the power voltage VDD is higher than the reference voltage level RV, the voltage detection signal SIGV may maintain the second level during a period after the fourth point in time t4. Because the wait signal SIGW maintains the second level during a period after the third point in time t3, the clock control signal SIGCC may maintain the second level in the period after the fourth point in time t4. During this period, the frequency CLKF of the clock signal may be controlled to be relatively high. The period after the fourth point in time t4 may be referred to as a second running period R2.

According to the present embodiment, the wait signal SIGW may maintain the first level based on the input counting value C1 in the period from the first point in time t1 to the third point in time t3, and even when the voltage level of the power voltage VDD is lower than the reference voltage level RV in the period from the second point in time t2 to the fourth point in time t4, the frequency CLKF of the clock signal may be set relatively low during a period from the third point in time t3 to the fourth point in time t4 by using the voltage detection signal SIGV. That is, the clock control signal SIGCC reflecting a change in the power voltage VDD in real time may be generated. Accordingly, the system-on-chip 20 may be stably driven.

Figure 12:
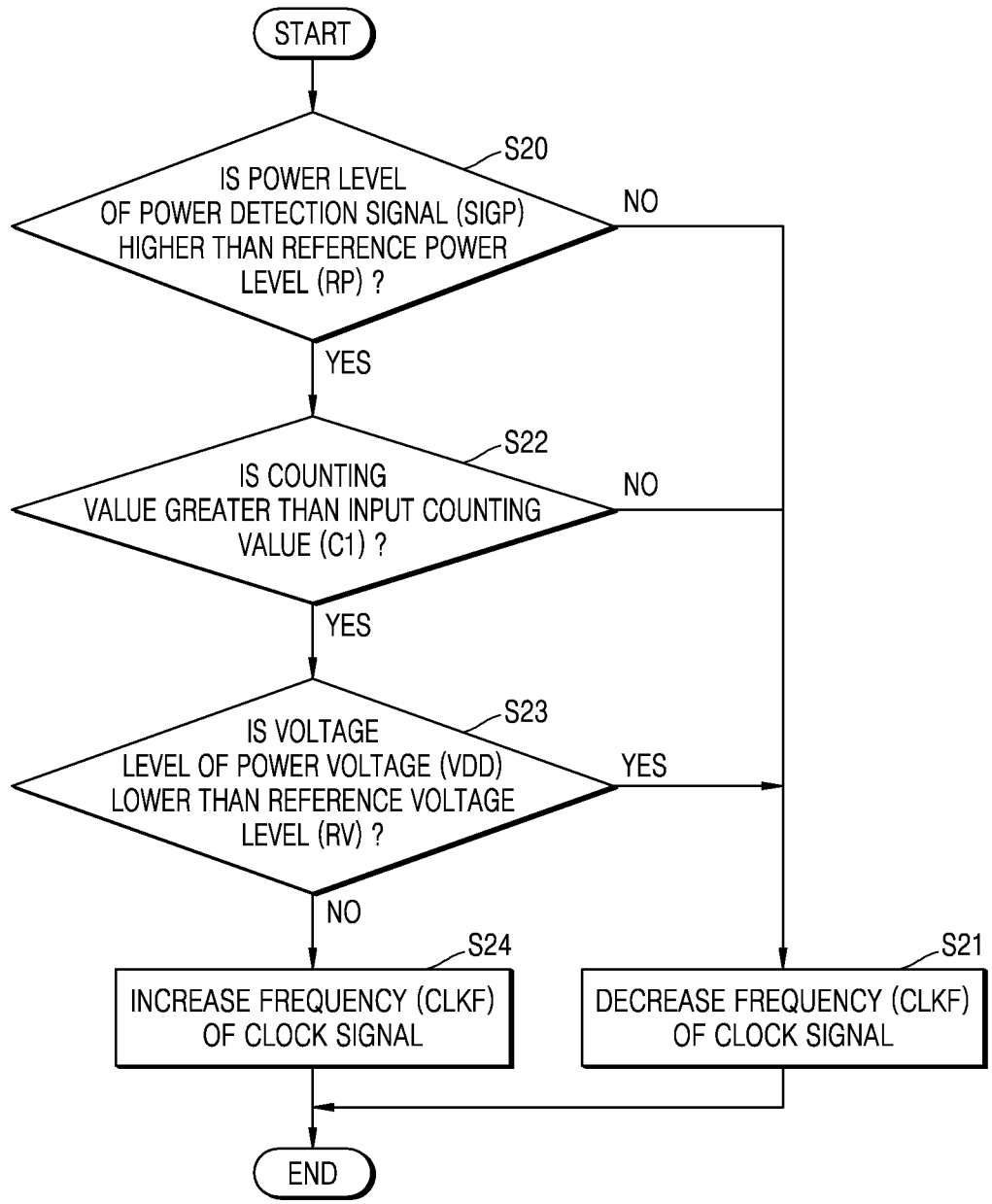
FIG. 12 is a flowchart that illustrates operations of a system-on-chip, according to an example embodiment.

FIG. 12 is a flowchart that illustrates operations of a system-on-chip, according to an example embodiment. In detail, FIG. 12 is a flowchart that illustrates the operations of the system-on-chip 20 of FIG. 9. Hereinafter, FIG. 12 will be described with reference to FIG. 9.

Referring to FIG. 12, in operation S20, the power level of the power detection signal SIGP may be compared with the reference power level RP. When the power level of the power detection signal SIGP is lower than the reference power level RP, the frequency CLKF of the clock signal may be relatively decreased according to operation S21. When the power level of the power detection signal SIGP is higher than the reference power level RP, a counting value may be compared with the input counting value C1 according to operation S22. When the counting value is less than the input counting value C1, the frequency CLKF of the clock signal may be relatively decreased (e.g., when the comparison signal SIGCP hasn't been fully extended by the input counting value C1). When the counting value is greater than the input counting value C1, the frequency CLKF of the clock signal may be restored according to operation S24. That is, the frequency CLKF of the clock signal may be controlled to be relatively high.

Figure 13:
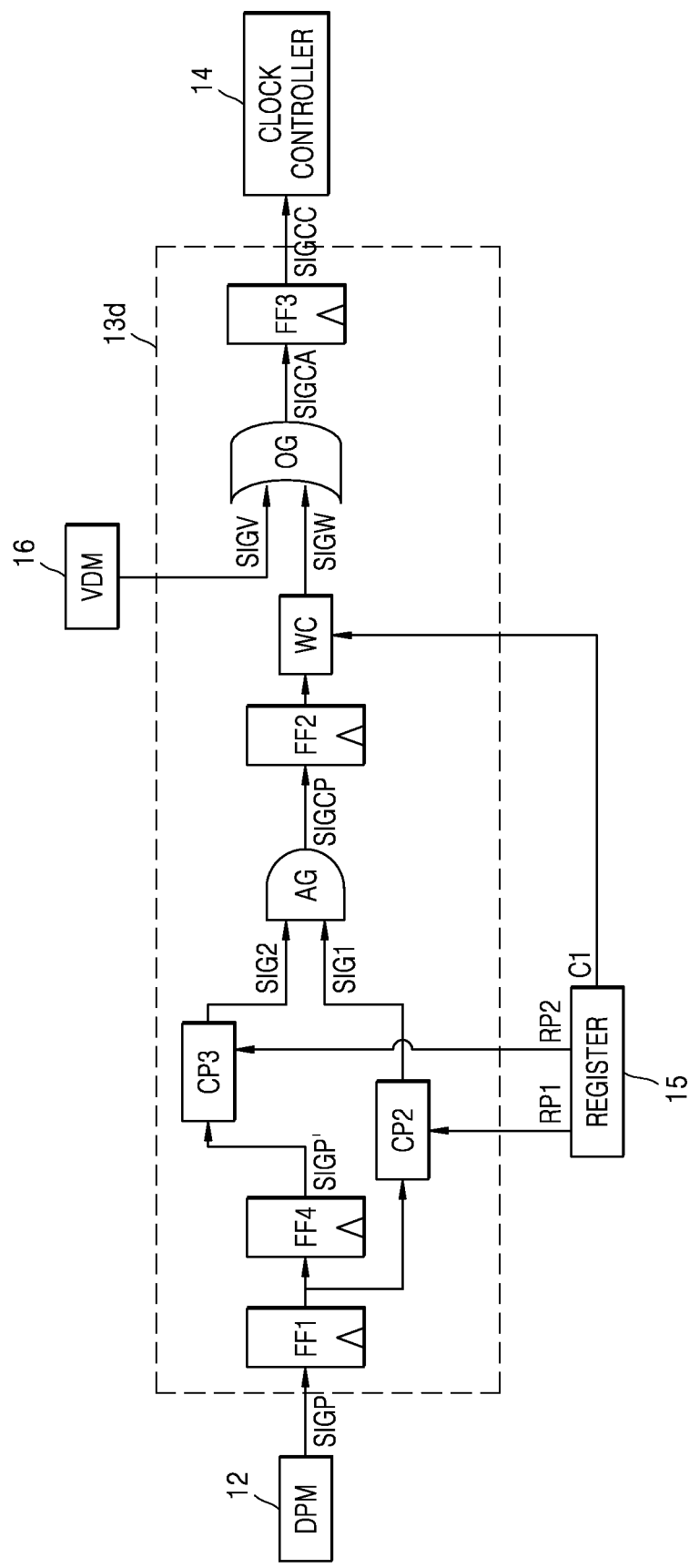
FIG. 13 is a block diagram that illustrates a system-on-chip according to an example embodiment.

FIG. 13 is a block diagram that illustrates a system-on-chip according to an example embodiment. In detail, FIG. 13 is a block diagram that illustrates an example of the frequency controller 13' of FIG. 8. Hereinafter, FIG. 13 will be described with reference to FIGS. 8 and 9, and repeated description of similar components may be omitted.

Referring to FIG. 13, a frequency controller 13d may include first to fourth flip-flops FF1 to FF4, second and third comparators CP2 and CP3, an AND gate AG, a waiting counter WC, and an OR gate OG. The first to fourth flip-flops FF1 to FF4, the second and third comparators CP2 and CP3, the AND gate AG, and the waiting counter WC may have identical configurations as those of FIG. 6.

The OR gate OG may have the same configuration as in FIG. 9. Accordingly, the OR gate OG may calculate the voltage detection signal SIGV and the wait signal SIGW to generate the calculation signal SIGCA. The calculation signal SIGCA may have the first level when either the voltage detection signal SIGV or the wait signal SIGW is at the first level (or both signals).

The third flip-flop FF3 may receive and store the calculation signal SIGCA, and may transmit the calculation signal SIGCA to the clock controller 14. An output signal of the third flip-flop FF3 may be referred to as the clock control signal SIGCC. When the third flip-flop FF3 is omitted, the calculation signal SIGCA may be transmitted to the clock controller 14 as the clock control signal SIGCC. Hereinafter, operations of the frequency controller 13d will be described in detail with reference to FIG. 14.

Figure 14:
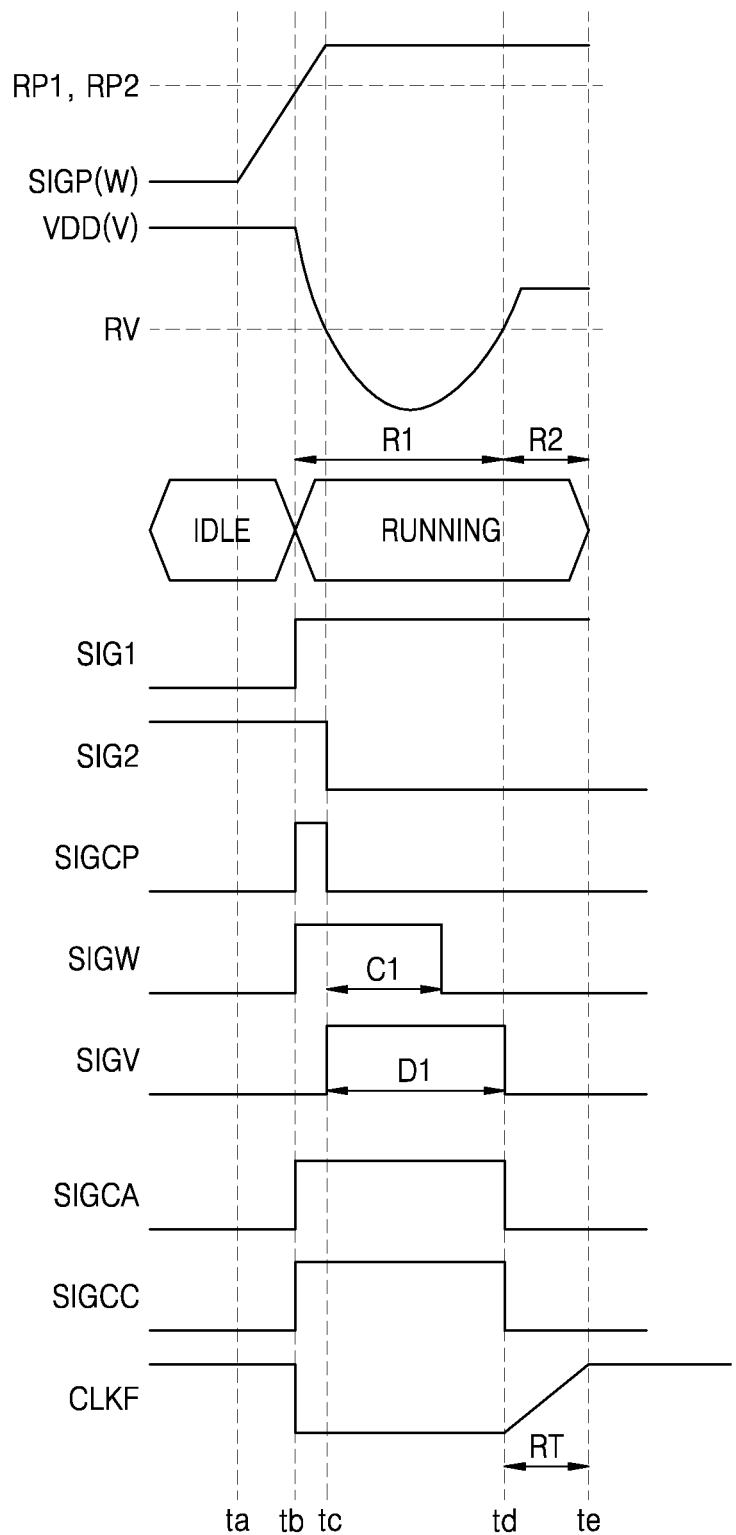
FIG. 14 is a diagram that illustrates operations of a system-on-chip, according to an example embodiment.

FIG. 14 is a diagram that illustrates operations of a system-on-chip, according to an example embodiment. In detail, FIG. 14 is a diagram that illustrates the operations of the system-on-chip 20 including the frequency controller 13d of FIG. 13. For convenience of description, the frequency controller 13d with the first to third flip-flops FF1 to FF3 omitted will be described. Hereinafter, FIG. 14 will be described with reference to FIGS. 8 and 9, and repeated description of similar components may be omitted.

Referring to FIG. 14, during a period from a first point in time ta to a second point in time tb, the level of the power detection signal SIGP may be lower than a first reference power level RP1. Accordingly, the power voltage VDD may be stably supplied to the functional circuit 11. The second comparator CP2 may detect the period from the first point in time ta to the second point in time tb as an idle period.

Because the level of the power detection signal is lower than the first reference power level RP1, a first internal signal SIG1 may have the second level, and a second internal signal SIG2 may have the first level. Accordingly, the comparison signal SIGCP may have the second level.

Because the voltage level of the power voltage VDD is higher than the reference voltage level RV, the voltage detection signal SIGV may have the second level. Accordingly, the calculation signal SIGCA may have the second level, and the frequency CLKF of the clock signal may be controlled to be relatively high. For example, the frequency CLKF of the clock signal may be controlled to be relatively high in the idle period.

At the second point in time tb, the level of the power detection signal SIGP may be higher than the first reference power level RP1. Accordingly, the second comparator CP2 may detect a period after the second point in time tb as a running period, and the first internal signal SIG1 may transition from the second level to the first level.

A third point in time tc may be a point in time at which one clock cycle has progressed from the second point in time tb. Accordingly, the second internal signal SIG2 may transition from the first level to the second level at the third point in time tc.

The comparison signal SIGCP may be a signal obtained by combining the first internal signal SIG1 with the second internal signal SIG2 through the AND gate AG. Accordingly, the comparison signal SIGCP may have the first level during a period from the second point in time tb to the third point in time tc.

The wait signal SIGW may be obtained by extending the first level period of the comparison signal SIGCP by the input counting value C1 through the waiting counter WC.

During a period from the third point in time tc to a fourth point in time td, the voltage level of the power voltage VDD may be lower than the reference voltage level RV. Accordingly, the voltage detection signal SIGV may transition from the second level to the first level.

Because the calculation signal SIGCA is output by calculating the wait signal SIGW and the voltage detection signal SIGV by using the OR gate OG, the calculation signal SIGCA may have the first level during a period from the second point in time tb to the fourth point in time td. Because the present embodiment describes a case in which the third flip-flop FF3 is omitted, the clock control signal SIGCC may be identical to the calculation signal SIGCA. Accordingly, since the calculation signal has the first level from tb to td, the frequency CLKF of the clock signal may be controlled to be relatively low during this period. During the running period, a period in which the frequency CLKF of the clock signal is controlled to be relatively low may be referred to as a first running period R1, and thus, the period from the second point in time tb to the fourth point in time td may be referred to as the first running period R1.

After the fourth point in time td, the voltage level of the power voltage VDD may be higher than the reference voltage level RV. That is, the power voltage VDD may be stably provided to the functional circuit 11. Because the wait signal SIGW and the voltage detection signal SIGV have the second level, the clock control signal SIGCC may have the second level. Accordingly, the frequency CLKF of the clock signal may be controlled to be relatively high.

During the running period, a period in which the frequency CLKF of the clock signal is controlled to be relatively high may be referred to as a second running period R2, and thus, the period after the fourth point in time td may be referred to as the second running period R2.

In the second running period R2, the frequency CLKF of the clock signal may be gradually increased during the ramp-up time RT. Accordingly, the frequency CLKF of the clock signal may be gradually increased during a period from the fourth point in time td to a fifth point in time te. The ramp-up time RT may be set in various ways by the user. For example, the ramp-up time RT may be determined algorithmically, through machine learning, or set directly by the user.

The frequency CLKF of the clock signal may be controlled to remain relatively high in the period from the second point in time tb to the fourth point in time td. The frequency CLKF of the clock signal may be maintained relatively high in the period from the fourth point in time td to the fifth point in time te. From the fourth point in time td to the fifth point in time te, the frequency CLKF of the clock signal may be gradually increased during the ramp-up time RT.

Figure 15:
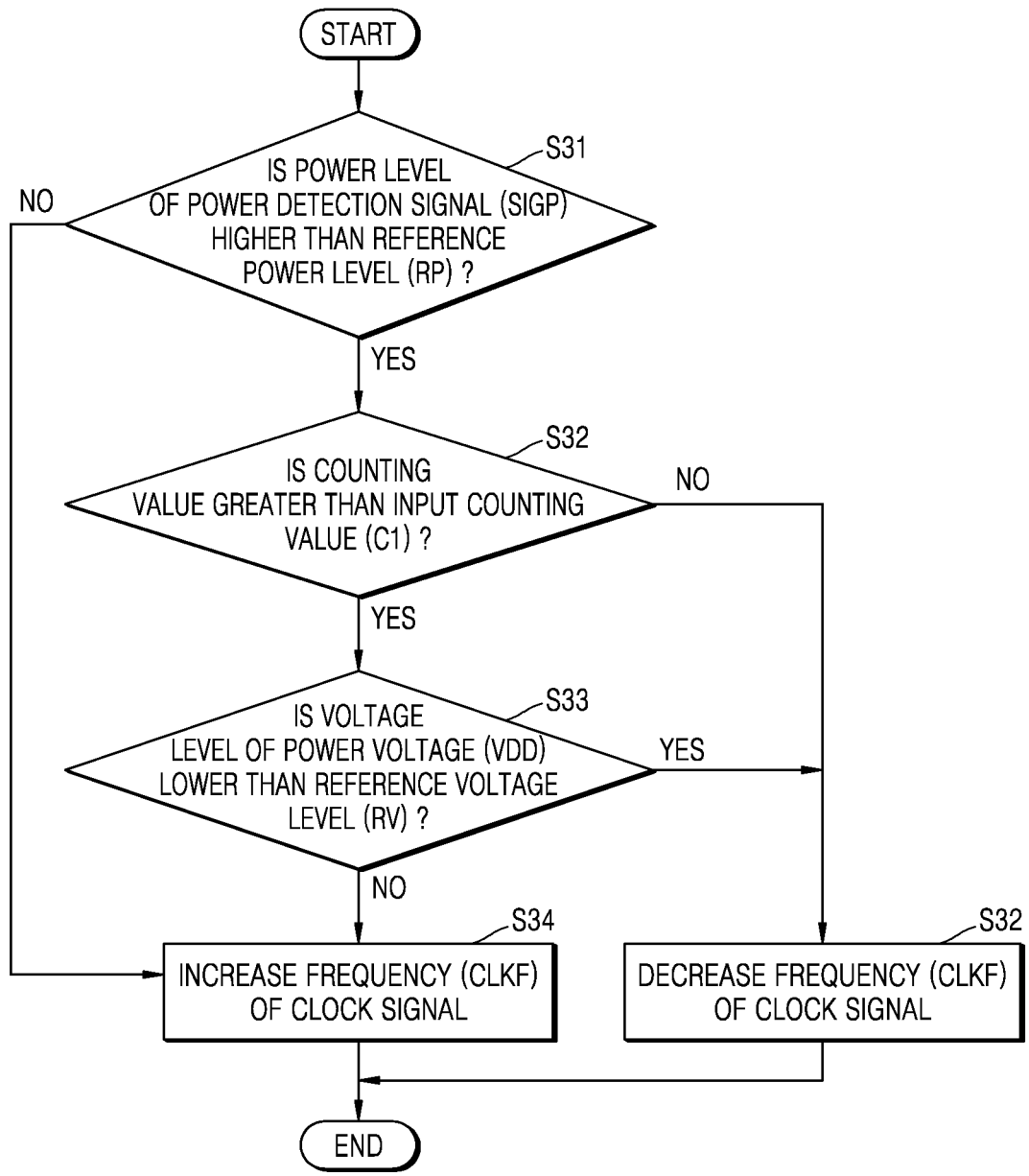
FIG. 15 is a flowchart that illustrates operations of a system-on-chip, according to an example embodiment.

FIG. 15 is a flowchart that illustrates operations of a system-on-chip, according to an example embodiment. In detail, FIG. 15 is a flowchart that illustrates the operations of the system-on-chip 20 of FIG. 13. Hereinafter, FIG. 15 will be described with reference to FIG. 13.

Referring to FIG. 15, in operation S31, the power level of the power detection signal SIGP may be compared with the reference power level RP. When the power level of the power detection signal SIGP is lower than the reference power level RP, the frequency CLKF of the clock signal may be controlled to be relatively high according to operation S34. For example, this may correspond to a case in which the system-on-chip 20 may operate in a high-clock state stably under supplied power. When the power level of the power detection signal SIGP is higher than the reference power level RP, a counting value may be compared with the input counting value C1 according to operation S32. When the counting value is less than the input counting value C1, the frequency CLKF of the clock signal may be controlled to be relatively low according to operation S32. When the counting value is greater than the input counting value C1, the voltage level of the power voltage VDD may be compared with the reference voltage level RV according to operation S33. When the voltage level of the power voltage VDD is lower than the reference voltage level RV, the frequency CLKF of the clock signal may be controlled to be relatively low according to operation S32. When the voltage level of the power voltage VDD is higher than the reference voltage level RV, the frequency CLKF of the clock signal may be controlled to be relatively high according to operation S34.

Figure 16:
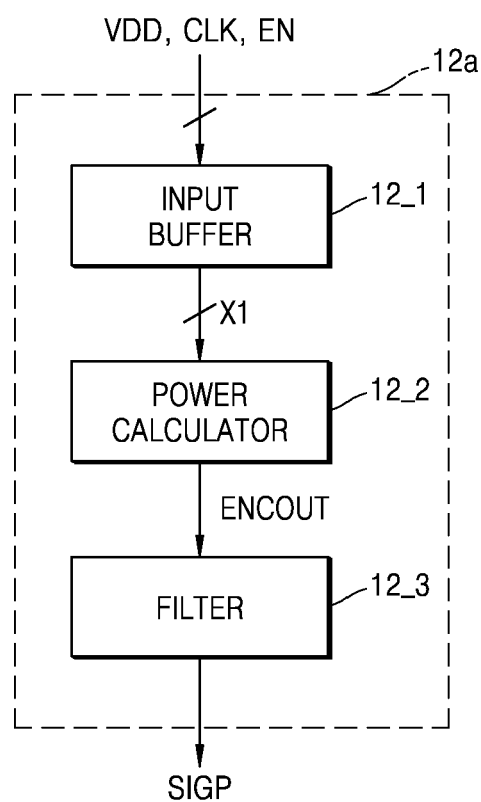
FIG. 16 is a block diagram that illustrates a dynamic power monitor according to embodiments.

FIG. 16 is a block diagram that illustrates a DPM 12a according to embodiments of the present disclosure. In detail, FIG. 16 is a block diagram that illustrates an embodiment of the DPM 12 shown in FIG. 1.

Referring to FIG. 16, the DPM 12a may include an input buffer 12_1, a power calculator 12_2, and a filter 12_3.

The input buffer 12_1 may receive the power voltage VDD, the clock signal CLK, and internal signals EN of the functional circuit 11. The input buffer 12_1 may receive the internal signals EN of the functional circuit 11 for each cycle of the clock signal CLK.

The internal signals EN may include a clock gating signal that activates the clock signal CLK, a functional circuit enable signal that activates the functional circuit 11, and/or a temperature signal that controls an operation of the functional circuit 11 depending on the temperature of the system-on-chip 10 or the functional circuit 11. Signal levels of the internal signals EN may be changed or switched according to a cycle of the clock signal CLK.

The input buffer 12_1 may include registers that store state values X1 of the internal signals EN. The state values X1 of the internal signals EN may a low level or a high level. Accordingly, the state values X1 of the internal signals EN may indicate dynamic power consumed by the functional circuit 11.

The state values X1 stored in the input buffer 12_1 may be changed or updated for each cycle of the clock signal CLK. The input buffer 12_1 may provide the state values X1 stored for each cycle of the clock signal CLK to the power calculator 12_2.

Based on the state values X1 received from the input buffer 12_1, the power calculator 12_2 may calculate a value of power consumed by the functional circuit 11, and output power classification values ENCOUT indicating a range to which the value of power consumed by the functional circuit 11 belongs. The range to which the value of power consumed by the functional circuit 11 belongs may refer to any range that is obtained by dividing a power range from minimum power of the functional circuit 11 to maximum power thereof. The power calculator 12_2 may repeatedly receive the state values X1 for each cycle of the clock signal CLK, and may repeatedly calculate and output the power classification values ENCOUT. The power calculator 12_2 may be implemented by, for example, hardware within the system-on-chip 10.

The filter 12_3 may repeatedly receive the power classification values ENCOUT calculated by the power calculator 12_2 for each cycle of the clock signal CLK. The filter 12_3 may accumulate the power classification values ENCOUT and may calculate a filtering value of the power classification values ENCOUT that have been accumulated. The filtering value may be an average value of the accumulated power classification values ENCOUT. The filtering value may be obtained by removing noise from the power classification values ENCOUT. The filter 12_3 may output the filtering value as the power detection signal SIGP. A stable power monitoring result may be output by the filter 12_3.

Figure 17:
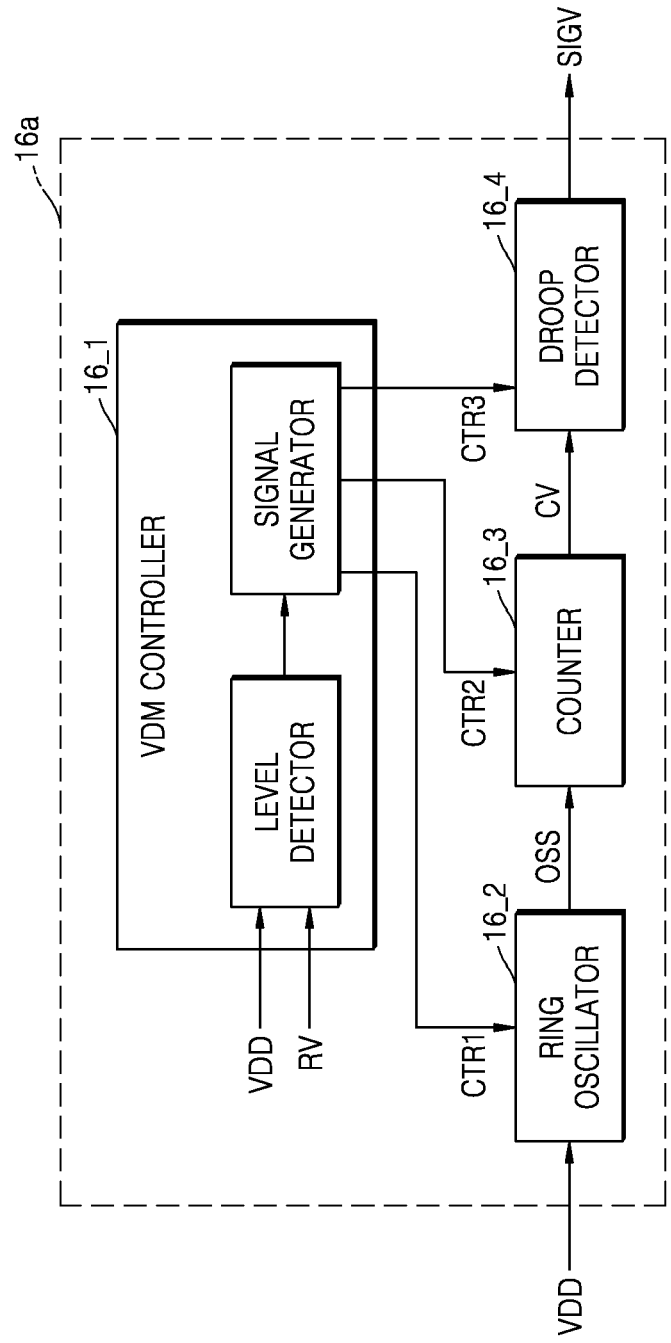
FIG. 17 is a block diagram that illustrates a voltage droop monitor according to embodiments.

FIG. 17 is a block diagram that illustrates a VDM 16a according to embodiments. In detail, FIG. 17 is a block diagram that illustrates an embodiment of the VDM 16 shown in FIG. 8.

Referring to FIG. 17, the VDM 16a may include a VDM controller 16_1, a ring oscillator block 16_2, a counter 16_3, and a droop detector 16_4.

The VDM controller 16_1 may receive the power voltage VDD and the reference voltage level RV, and may generate first to third control signals CTL1 to CTL3 based on the voltage level of the power voltage VDD. Levels of the power voltage VDD and the reference voltage level RV may vary according to dynamic voltage frequency scaling (hereinafter referred to as DVFS).

The VDM controller 16_1 may control the ring oscillator block 16_2, the counter 16_3, and the droop detector 16_4 by using the first to third control signals CTL1 to CTL3, respectively. The first control signal CTL1 may include information on a temperature and DVFS of the semiconductor device, the second control signal CTL2 may include information on a reference period, and the third control signal CTL3 may include at least one threshold voltage level. The VDM controller 16_1 may transmit the first control signal CTL1 to the ring oscillator block 16_2, transmit the second control signal CTL2 to the counter 16_3, and transmit the third control signal CTL3 to the droop detector 16_4.

The ring oscillator block 16_2 may include a plurality of ring oscillators that are provided with the power voltage VDD to operate. The plurality of ring oscillators may generate a plurality of oscillation signals. The ring oscillator block selects one among the plurality of oscillation signals to output a selected oscillation signal OSS.

The counter counts the selected oscillation signal OSS during the reference period to provide a counting signal CV.

The droop detector 16_4 may compare the counting signal CV with the at least one threshold voltage included in the third control signal CTL3. Accordingly, the droop detector 16_4 outputs the voltage detection signal SIGV which indicates whether a droop has occurred in the power voltage VDD. When a droop occurs in the power voltage VDD, the droop detector 16_4 may output the voltage detection signal SIGV having a high level. When the droop that has occurred is released, the droop detector 16_4 may change the level of the voltage detection signal SIGV from the high level to a low level. In another embodiment, when a droop occurs in the power voltage VDD, the droop detector 16_4 may output the power detection signal SIGV having the low level. In another embodiment, when a droop occurs in the power voltage VDD, the droop detector 16_4 may output the voltage detection signal SIGV that includes a plurality of bits indicating the degree to which the voltage level of the power voltage VDD has dropped.

Figure 18:
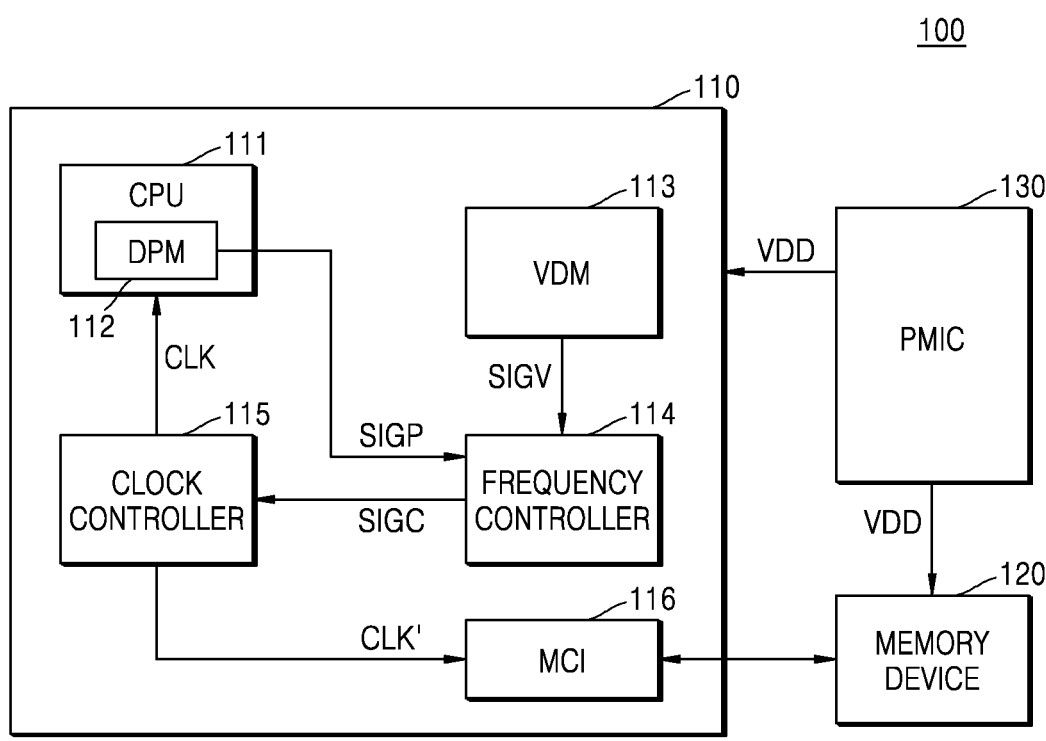
FIG. 18 is a block diagram that illustrates a data processing system including a system-on-chip, according to embodiments.

FIG. 18 is a block diagram that illustrates a data processing system 100 including a system-on-chip, according to embodiments of the present disclosure.

Referring to FIG. 18, the data processing system 100 may include an application processor AP 110, a memory device 120, and a power management integrated circuit (PMIC) 130.

The data processing system 100 may correspond to a computing system of various types, and may correspond to, for example, a mobile system employing the AP 110.

The AP 110 may be implemented as a system-on-chip according to embodiments of the present disclosure. The system-on-chip may include a system bus to which a protocol having a standard bus specification is applied, and may include various intellectual property (IP) devices connected to the system bus. The standard specification of a system bus may include the Advanced Microcontroller Bus Architecture (AMBA) protocol from Advanced RISC Machine (ARM).

The memory device 120 may be a semiconductor memory device, and may be implemented in various ways. For example, the memory device 120 may include dynamic random access memory (DRAM) such as double data rate synchronous dynamic random access memory (DDR SDRAM), low power double data rate (LPDDR) SDRAM, graphics double data rate (GDDR) SDRAM, rambus dynamic random access memory (RDRAM), or the like.

The PMIC 130 may provide the power voltage VDD to the AP 110 and the memory device 120. The PMIC 130 may provide power voltages VDD which have different power levels from each other to the AP 110 and the memory device 120. The PMIC 130 may constitute the AP 110 and a separate system-on-chip, respectively, or may constitute a single system-on-chip.

The AP 110 may include a CPU 111, a DPM 112, a VDM 113, a frequency controller 114, a clock controller 115, and a memory control interface 116. The CPU 111, the DPM 112, VDM 113, the frequency controller 114, the clock controller 115, and the memory control interface 116 may each constitute a functional circuit. Thus, the CPU 111, the DPM 112, VDM 113, the frequency controller 114, the clock controller 115, and/or the memory control interface 116 may each correspond to the functional circuit 11 of FIGS. 1 and 8.

The CPU 111 may control various functional blocks in the AP 110. The CPU 111 may exchange data access requests with the memory device 120 through the memory control interface 116. In an embodiment, by measuring a power voltage level after the power voltage VDD is applied to the CPU 111, it may be determined whether the embodiments described through FIGS. 1 to 17 have been applied to the data processing system 100. In another embodiment, by measuring the power voltage level after the power voltage VDD and the clock signal CLK are applied to the CPU 111, it may be determined whether the embodiments described through FIGS. 1 to 17 have been applied to the data processing system 100.

The DPM 112 may be included in the CPU 111. The DPM 112 may calculate a value of power consumed by the CPU 111 and transmit the calculated value to the frequency controller 114 as the power detection signal SIGP. The DPM 112 may monitor power consumption in real time. The DPM 112 may include components identical to those of the DPM 12*a* of FIG. 16.

The VDM 113 may monitor the voltage level of the power voltage VDD provided to the CPU 111. When a droop occurs in the power voltage VDD, the VDM 113 may provide the voltage detection signal SIGV indicating the occurrence of the droop to the frequency controller 114. The VDM 113 may include components identical to those of the VDM 16*a* of FIG. 17. The VDM 113 may optionally be omitted.

The frequency controller 114 may receive the power detection signal SIGP output from the DPM 112 and the voltage detection signal SIGV output from the VDM 113 to generate the clock control signal SIGCC. The frequency controller 114 may transmit the clock control signal SIGCC to the clock controller 115. The frequency of the clock signal CLK transmitted to the CPU 111 may be changed based on the clock control signal SIGCC. The clock rate of the CPU may be determined by the clock signal CLK. The frequency controller 114 may be any one of the frequency controllers 13*a* to 13*d* described above.

The clock controller 115 may generate a clock signal CLK' and control a frequency of the clock signal CLK'. The clock controller 115 may modulate the frequency of the clock signal CLK based on the clock control signal SIGCC received from the frequency controller 114. The clock controller 115 may provide the clock signal CLK' to the memory control interface 116. The frequency of the clock signal CLK' provided to the memory control interface 116 may be equal to or different from the frequency of the clock signal CLK provided to the CPU 111.

The memory control interface 116 may provide a command to the memory device 120 according to a request of the CPU 111. The memory control interface 116 may record data to the memory device 120 or read data from the memory device 120, depending on an operation of the AP 110.

Figure 19:
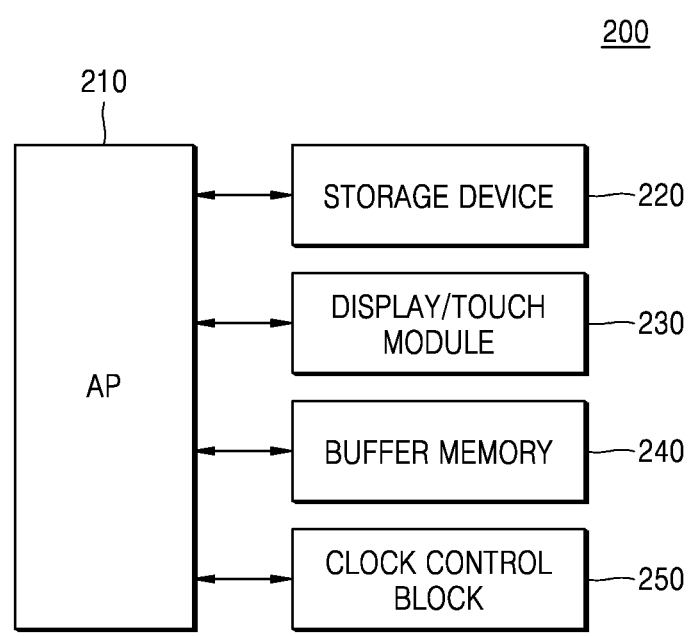
FIG. 19 is a block diagram that illustrates a mobile system including a system-on-chip, according to embodiments.

FIG. 19 is a block diagram that illustrates a mobile system 200 including a system-on-chip, according to embodiments of the present disclosure.

Referring to FIG. 19, the mobile system 200 may include a processor 210, a storage device 220, a display/touch module 230, a buffer memory 240, and a clock control block 250. The mobile system 200 may include a personal digital assistant (PDA), a portable computer, a web tablet, a wireless phone, a mobile phone, a digital music player, a memory card, or the like.

The processor 210 may be configured to control overall operations of the mobile system 200 and wired/wireless communication with the outside. For example, the processor 210 may include an AP, an integrated modem application processor (ModAP), or the like. The processor 210 may include the DPM and the VDM described above with reference to FIGS. 1 to 17. Accordingly, a droop in a power voltage supplied to the processor 210 may be lessened, and the stability of the mobile system 200 may be increased.

The storage device 220 may include an embedded multimedia card (eMMC), a solid state drive (SSD), a universal flash storage (UFS), or the like. The storage device 220 may include at least one non-volatile memory device. The non-volatile memory device may include NAND flash memory, vertical NAND (VNAND) flash memory, NOR flash memory, resistive random access memory (RRAM), phase-change memory (PRAM), magnetoresistive random access memory (MRAM), ferroelectric random access memory (FRAM), spin transfer torque random access memory (STT-RAM), or the like. The storage device 220 may store data input by the user through the display/touch module 230.

The display/touch module 230 may display data processed by the processor 210. The display/touch module 230 may receive data from a touch panel. The user may input data through the display/touch module 230. In an embodiment, when the display/touch module 230 receives data from the touch panel, it may be checked whether the embodiments described through FIGS. 1 to 17 have been applied to the mobile system 200 by measuring a power voltage level of the processor 210.

The buffer memory 240 may temporarily store data required for a processing operation of the mobile system 200.

The clock control block 250 may include components of the system-on-chips 10 and 20 described above with reference to FIGS. 1 and 8. The clock control block 250 may detect dynamic power consumed by the processor 210 and a voltage droop in at least one power line. The clock control block 250 may generate a clock signal having a frequency modulated according to the detection result, and may provide the clock signal to the processor 210.

The mobile system 200 according to the present embodiment may calculate the dynamic power consumed by the processor 210, and by detecting the voltage droop and modulating the frequency of the clock signal, may prevent the voltage droop in the power line. Accordingly, the operations of the mobile system 200 may be stably performed, and unnecessary power consumption may be reduced.

While the inventive concept has been particularly shown and described with reference to embodiments thereof, it will be understood that various changes in form and details may be made therein without departing from the spirit and scope of the following claims.

What is claimed is:

1. A system-on-chip comprising:
   a dynamic power monitor configured to generate a power detection signal by calculating an amount of power consumed by a functional circuit;
   a frequency controller configured to detect an idle period and a running period of the functional circuit in response to the power detection signal, and to generate a clock control signal based on the power detection signal; and
   a clock controller configured to change a frequency of a clock signal provided to the functional circuit, based on the clock control signal,
   wherein the running period comprises:
   a first running period in which the frequency of the clock signal has a first value based on the clock control signal; and
   a second running period in which the frequency of the clock signal has a second value that is greater than the first value and based on the clock control signal.

2. The system-on-chip of claim 1, wherein, in the idle period, the frequency of the clock signal has the first value based on the clock control signal.

3. The system-on-chip of claim 1, wherein, in the idle period, the frequency of the clock signal has the second value based on the clock control signal.

4. The system-on-chip of claim 1, wherein the frequency of the clock signal gradually changes from the first value to the second value during a first time in the second running period.

5. The system-on-chip of claim 1, wherein the frequency controller comprises:
   a comparator configured to generate a comparison signal, wherein the comparison signal is based on the power detection signal and a reference power level, wherein the comparison signal has a first level when the power detection signal is lower than the reference power level, and wherein the comparison signal has a second level when the power detection signal is higher than the reference power level; and
   a waiting counter configured to generate a wait signal by extending a period of the comparison signal in the first level according to an input counting value.

6. The system-on-chip of claim 5, wherein the frequency controller further comprises at least one flip-flop configured to delay a transmission speed of at least one of the power detection signal, the comparison signal, and the wait signal.

7. The system-on-chip of claim 5, further comprising a voltage droop monitor configured to generate a voltage detection signal by monitoring a power voltage provided to the functional circuit, and to transmit the voltage detection signal to the frequency controller.

8. The system-on-chip of claim 7, wherein the frequency controller further comprises an OR gate configured to generate the clock control signal by receiving the wait signal and the voltage detection signal and performing an OR operation thereon.

9. The system-on-chip of claim 5, further comprising a register configured to store the reference power level and the input counting value, and further configured to transmit the reference power level and the input counting value to the comparator and the waiting counter, respectively.

10. The system-on-chip of claim 9, wherein the register is further configured to optimize the reference power level and the input counting value by using machine learning.

11. A system-on-chip comprising:
    a dynamic power monitor configured to generate a power detection signal by calculating power consumed by a functional circuit;
    a frequency controller configured to generate a clock control signal in response to the power detection signal; and
    a clock controller configured to change a frequency of a clock signal based on the clock control signal, and to transmit the clock signal with a changed frequency to the functional circuit,
    wherein the frequency controller comprises:
    a comparison block configured to generate a comparison signal by comparing the power detection signal with a reference power level; and
    a waiting counter configured to generate a wait signal by extending a period of the comparison signal in a first level, wherein the extension is based on an input counting value.

12. The system-on-chip of claim 11, further comprising a voltage droop monitor configured to generate, by monitoring a power voltage provided to the functional circuit, a voltage detection signal having the first level when a voltage level of the power voltage is lower than a reference voltage level, and to transmit the voltage detection signal to the frequency controller.

13. The system-on-chip of claim 11, wherein the waiting counter is further configured to set a counting value to 0 when the comparison signal transitions from the first level to a second level that is different from the first level, and to generate a wait signal by extending, while increasing the counting value by 1, the first level period of the comparison signal until the counting value becomes greater than the input counting value.

14. The system-on-chip of claim 11, wherein the comparison block comprises:
    a flip-flop configured to output a power delay signal by delaying the power detection signal;
    a first comparator configured to output, by comparing the power detection signal with the reference power level, a first internal signal having the first level when a power level of the power detection signal is higher than the reference power level;
    a second comparator configured to output, by comparing the power delay signal with the reference power level, a second internal signal having a second level that is different from the first level when the power level of the power delay signal is higher than the reference power level; and
    an AND gate configured to generate the comparison signal by performing an AND operation based on the first internal signal and the second internal signal.

15. The system-on-chip of claim 14, further comprising a voltage droop monitor configured to generate a voltage detection signal by monitoring a power voltage provided to the functional circuit, and to transmit the voltage detection signal to the frequency controller,
    wherein the frequency controller further comprises an OR gate configured to perform an OR operation based on the voltage detection signal and the wait signal.

16. The system-on-chip of claim 11, further comprising a register configured to store the reference power level and the input counting value, and to transmit the reference power level and the input counting value to the comparison block and the waiting counter, respectively.

17. An operating method of a system-on-chip including a functional circuit, the operating method comprising:
    generating a value of power consumed by the functional circuit as a power detection signal;
    generating a comparison signal by comparing a reference power level with the power detection signal;
    generating a wait signal by extending a period of the comparison signal in a first level, wherein the extension is based on an input counting value; and
    changing a frequency of a clock signal provided to the functional circuit, based on the wait signal.

18. The operating method of claim 17, further comprising:
    measuring a voltage level of a power voltage provided to the functional circuit; and
    generating a voltage detection signal by comparing a reference voltage level with the voltage level of the power voltage.

19. The operating method of claim 18, wherein the changing a frequency of a clock signal provided to the functional circuit comprises:
    performing an OR operation based on the wait signal and the voltage detection signal; and
    changing the frequency of the clock signal provided to the functional circuit, based on a result of the OR operation.

20. The operating method of claim 17, wherein the generating of the comparison signal comprises:
    generating a power delay signal by delaying a transmission speed of the power detection signal;
    generating a first internal signal which transitions from a second level to the first level, wherein the second level is different from the first level, and wherein the transition to the first level is based on whether a level of the power detection signal is higher than the reference power level;
    generating a second internal signal which transitions from the first level to the second level, wherein the transition to the second level is based on whether a level of the power delay signal is higher than the reference power level; and
    generating the comparison signal by performing an AND operation on the first internal signal and the second internal signal.

* * * * *